United States Patent
Yoshizawa

(10) Patent No.: US 12,199,569 B2
(45) Date of Patent: Jan. 14, 2025

(54) OSCILLATOR AND SIGNAL PROCESSING APPARATUS

(71) Applicant: SONY SEMICONDUCTOR SOLUTIONS CORPORATION, Kanagawa (JP)

(72) Inventor: Satoshi Yoshizawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/252,383

(22) PCT Filed: Nov. 10, 2021

(86) PCT No.: PCT/JP2021/041383
§ 371 (c)(1),
(2) Date: May 10, 2023

(87) PCT Pub. No.: WO2022/107668
PCT Pub. Date: May 27, 2022

(65) Prior Publication Data
US 2023/0412125 A1    Dec. 21, 2023

(30) Foreign Application Priority Data
Nov. 20, 2020 (JP) .................................. 2020-193369

(51) Int. Cl.
*H03B 5/12* (2006.01)
*H03L 7/099* (2006.01)

(52) U.S. Cl.
CPC ......... *H03B 5/1228* (2013.01); *H03B 5/1215* (2013.01); *H03B 5/1265* (2013.01);
(Continued)

(58) Field of Classification Search
CPC .................................................... H03B 5/1228
(Continued)

(56) References Cited

U.S. PATENT DOCUMENTS

| 10,749,468 B1 * | 8/2020 | Park ........................ H03L 7/093 |
| 2011/0018645 A1 * | 1/2011 | Chang .................. H03B 5/1225 |
| | | 331/117 FE |

(Continued)

FOREIGN PATENT DOCUMENTS

| JP | 2010-056856 A | 3/2010 |
| JP | 2014-502820 A | 2/2014 |
| JP | 2014-506102 A | 3/2014 |

OTHER PUBLICATIONS

International Search Report and Written Opinion of PCT Application No. PCT/JP2021/041383, issued on Dec. 21, 2021, 09 pages of ISRWO.

(Continued)

*Primary Examiner* — Joseph Chang
(74) *Attorney, Agent, or Firm* — CHIP LAW GROUP

(57) ABSTRACT

According to the present technology, there is provided an oscillator that functions as a transformer-based LC oscillator including a first capacitor group connected in parallel to a primary-side winding of a transformer and forming a first LC tank together with the primary-side winding, and a second capacitor group connected in parallel to a secondary-side winding of the transformer and forming a second LC tank together with the secondary-side winding, the oscillator including: a first type capacitor bank that is a capacitor bank having a maximum variable capacity of a predetermined value or more, and a second type capacitor bank that is a capacitor bank having a maximum variable capacity of less than the predetermined value, as capacitor banks for oscillation frequency tuning, in which the first type capacitor (Continued)

banks are arranged in both of the first capacitor group and the second capacitor group.

12 Claims, 17 Drawing Sheets

(52) U.S. Cl.
CPC ......... *H03B 5/1296* (2013.01); *H03L 7/0992* (2013.01); *H03L 2207/50* (2013.01)

(58) Field of Classification Search
USPC .................................................. 331/117 FE
See application file for complete search history.

(56) References Cited

U.S. PATENT DOCUMENTS

| | | |
|---|---|---|
| 2014/0320215 A1 | 10/2014 | Staszewski et al. |
| 2016/0056762 A1 | 2/2016 | Ximenes et al. |
| 2019/0229675 A1* | 7/2019 | Bozorg ................. H04L 27/227 |
| 2019/0267944 A1 | 8/2019 | Li et al. |

OTHER PUBLICATIONS

Babaie, et al., "A Class-F CMOS Oscillator", IEEE Journal of Solid-State Circuits, vol. 48, No. 12, Dec. 2013, pp. 3120-3133.

* cited by examiner 100 (OSCILLATOR)

5a (COARSE TUNING CAPACITOR BANK)

5a 1 (OSCILLATOR)

OSCILLATOR AND SIGNAL PROCESSING APPARATUS

CROSS REFERENCE TO RELATED APPLICATIONS

This application is a U.S. National Phase of International Patent Application No. PCT/JP2021/041383 filed on Nov. 10, 2021, which claims priority benefit of Japanese Patent Application No. JP 2020-193369 filed in the Japan Patent Office on Nov. 20, 2020. Each of the above-referenced applications is hereby incorporated herein by reference in its entirety.

TECHNICAL FIELD

The present technology relates to a technical field related to an oscillator as a transformer-based LC oscillator and a signal processing apparatus that performs signal processing on the basis of a periodic signal obtained by the oscillator.

BACKGROUND ART

As an LC oscillator, there is an LC oscillator including a capacitor bank configured such that a capacity value can be changed. In this type of LC oscillator, the oscillation frequency can be tuned by changing the capacity value of the capacitor bank.

Furthermore, examples of an LC oscillator include an inductor-based LC oscillator that includes only a single LC tank (resonance circuit) and oscillates in a sine wave; and a transformer-based LC oscillator that includes a first LC tank having a primary-side winding of a transformer and a first capacitor connected in parallel thereto, and a second LC tank having a secondary-side winding of the transformer and a second capacitor connected in parallel thereto, and oscillates in a pseudo square wave.

As disclosed in Non-Patent Document 1 below, in a transformer-based LC oscillator, oscillation in a third harmonic wave is enabled by the action of two LC tanks on a primary side and a secondary side, and oscillation in a pseudo square wave is enabled by adding the first and third harmonic waves. Since the pseudo square wave can increase the inclination of the zero-cross point with respect to the sine wave, an error in the zero-cross timing, that is, a phase error (phase noise) of the oscillation signal, can be suppressed.

Note that Patent Literature 1 below discloses a technology for tuning the oscillation frequency by changing the secondary inductance to change the effective value of the primary inductance through a change in the transconductance.

CITATION LIST

Patent Document

Patent Document 1: Japanese Unexamined Patent Application Publication 2014-506102

Non-Patent Document

Non-Patent Document 1: IEEE JOURNAL OF SOLID-STATE CIRCUITS, VOL. 48, NO. 12, December 2013 "A Class-F CMOS Oscillator", Masoud Babaie, Student Member, IEEE, and Robert Bogdan Staszewski, Fellow, IEEE

SUMMARY OF THE INVENTION

Problems to be Solved by the Invention

Here, in the transformer-based LC oscillator, a capacitor group (first capacitor group) forming the LC tank on the primary side and a capacitor group (second capacitor group) forming the LC tank on the secondary side are provided. However, in the transformer-based LC oscillator in the related art, a capacitor bank for capacity control is arranged only in one of these two capacitor groups. For example, in Non-Patent Document 1, a capacitor bank for coarse tuning of an oscillation frequency is arranged only in the capacitor group on the secondary side.

However, in this configuration, the LC tank ratio X between the two LC tanks changes according to the change in capacity value of the capacitor bank due to the frequency tuning. The LC tank ratio X is a value obtained by "$X=L_s \cdot c_2/(L_p \cdot c_1)$" when inductances in the LC tanks on the primary side and the secondary side are denoted by $L_p$ and $L_s$, respectively, and capacity values (capacitances) of the capacitor groups on the primary side and the secondary side are denoted by $c_1$ and $c_2$, respectively.

When the LC tank ratio X changes, as the input impedance characteristic of the oscillator, the peak position of the input impedance corresponding to the third harmonic wave deviates from the expected position (frequency), and the peak amplitude decreases. As a result, the waveform of the pseudo square wave collapses, leading to an increase in phase noise.

The present technology has been made in view of the above circumstances, and an object thereof is to suppress phase noise in a transformer-based LC oscillator.

Solutions to Problems

According to the present technology, there is provided an oscillator that functions as a transformer-based LC oscillator including a first capacitor group connected in parallel to a primary-side winding of a transformer and forming a first LC tank together with the primary-side winding, and a second capacitor group connected in parallel to a secondary-side winding of the transformer and forming a second LC tank together with the secondary-side winding, the oscillator including: a first type capacitor bank that is a capacitor bank having a maximum variable capacity of a predetermined value or more, and a second type capacitor bank that is a capacitor bank having a maximum variable capacity of less than the predetermined value, as capacitor banks for oscillation frequency tuning, in which the first type capacitor banks are arranged in both of the first capacitor group and the second capacitor group.

By arranging the capacitor banks in both of the first and second capacitor groups, it is possible to prevent the LC tank ratio from changing even when the capacity value of the capacitor bank changes for the oscillation frequency tuning. At this time, by arranging the first type capacitor banks having a large maximum variable capacity in both of the first and second capacitor groups, it is possible to effectively suppress the change amount of the LC tank ratio accompanying the oscillation frequency tuning.

In the oscillator according to the present technology described above, the first type capacitor bank in the first capacitor group and the first type capacitor bank in the second capacitor group may have the same number of unit cells as a minimum unit of variable capacity.

Since the number of unit cells is the same, even in a case where all the unit cells of the first type capacitor banks are turned on in both of the first and second capacitor groups, the uniformity of the LC tank ratio can be maintained.

In the oscillator according to the present technology described above, the first type capacitor bank in the first capacitor group and the first type capacitor bank in the second capacitor group may be arranged adjacent to each other in a plan view.

Arranging two capacitor banks adjacent to each other means that the capacitor banks are arranged without interposing another element therebetween.

In the oscillator according to the present technology described above, a capacitor bank for PVT compensation may further be provided as the capacitor bank.

Thus, PVT compensation can be performed for tuning of the oscillation frequency.

In the oscillator according to the present technology described above, the capacitor bank for PVT compensation may be arranged in both of the first capacitor group and the second capacitor group.

By arranging the capacitor banks for PVT compensation in both of the first and second capacitor groups, it is possible to prevent the LC tank ratio between the first and second LC tanks from changing according to the change in capacity for PVT compensation.

In the oscillator according to the present technology described above, a capacitor bank for fine tuning that is a capacitor bank having a minimum maximum variable capacity, and a capacitor bank for coarse tuning that is a capacitor bank having a maximum variable capacity larger than that of the capacitor bank for fine tuning, may further be provided as the capacitor banks, and the capacitor bank for coarse tuning may be arranged in both of the first capacitor group and the second capacitor group.

By providing the capacitor bank for fine tuning, fine tuning of the oscillation frequency is possible, and by arranging the capacitor banks for coarse tuning having a large maximum variable capacity in both of the first and second capacitor groups, it is possible to prevent the LC tank ratio between the first and second LC tanks from greatly changing.

In the oscillator according to the present technology described above, the capacitor bank for fine tuning may be arranged in the second capacitor group.

As a result, the capacitor bank for fine tuning is inserted between the gates of the cross-coupled transistors in the transformer-based LC oscillator.

In the oscillator according to the present technology described above, the capacitor bank for fine tuning may be arranged in the first capacitor group.

Accordingly, it is possible to add capacity to the first capacitor group in response to a case where the primary-side winding is arranged inside the secondary-side winding and the inductance of the primary-side winding is smaller than the inductance of the secondary-side winding.

In the oscillator according to the present technology described above, the first capacitor group may be connected to each drain of a cross-coupled transistor, and the second capacitor group may be connected to each gate of the cross-coupled transistor.

As a result, a transformer-based LC oscillator is realized.

In the oscillator according to the present technology described above, each of the first type capacitor bank in the first capacitor group and the first type capacitor bank in the second capacitor group may include a plurality of unit cells each serving as a minimum unit of a variable capacity, the oscillator may include a control unit configured to change an oscillation frequency by performing on/off control of the unit cell on the basis of a frequency control signal indicating the number of capacity change stages, and when the number of capacity change stages indicated by the frequency control signal is N (N is an integer equal to or greater than 0), the control unit may perform, as capacity control based on the frequency control signal, control to turn on (a quotient of N/2) unit cells for the first type capacitor bank in one of the first and second capacitor groups, and turn on N−(a quotient of N/2) unit cells for the first type capacitor bank in the other of the first and second capacitor groups.

In the oscillation frequency tuning, as a method of controlling the capacities of the first type capacitor banks arranged in both of the first and second capacitor groups while suppressing the change in the LC tank ratio, a method of performing control to turn on N unit cells in both of the first type capacitor banks with respect to the number of capacity change stages N indicated by the frequency control signal is considered. The method of turning on the N unit cells in both of the first type capacitor banks as described above is suitable in terms of not causing a change in the LC tank ratio at the time of oscillation frequency tuning, but the capacity change amount for one stage of control is twice the variable capacity for one unit cell, and it is necessary to reduce the variable capacity for one unit cell to ½ in order to maintain the capacity change amount for one stage of control in the case of adopting the inductor-based configuration. However, in a case where the first type capacitor bank is a capacitor bank for coarse tuning, since the capacity change amount for each unit cell is originally small, it is practically difficult to reduce the capacity change amount for one unit cell to ½. That is, it is difficult to realize a transformer-based LC oscillator in which the first type capacitor banks are arranged in both of the first and second capacitor groups.

In the oscillator according to the present technology described above, the frequency control signal may include a plurality of control bits, each control bit may be a signal indicating presence or absence of a capacity change for one stage, and the control unit may use a value of an even-numbered control bit of the frequency control signal as an on/off control value of the unit cell in the first type capacitor bank in one of the first and second capacitor groups, and use a value of an odd-numbered control bit of the frequency control signal as an on/off control value of the unit cell in the first type capacitor bank in the other of the first and second capacitor groups.

As a result, it is possible to easily realize the capacity control in which one of the first type capacitor banks arranged in both of the first and second capacitor groups turns on (a quotient of N/2) unit cells and the other turns on N−(a quotient of N/2) unit cells.

In the oscillator according to the present technology described above, a capacitor bank for PVT compensation and a capacitor bank for coarse tuning having a minimum variable capacity smaller than that of the capacitor bank for PVT compensation, as the capacitor banks, may further be provided, the capacitor bank for PVT compensation and the capacitor bank for coarse tuning may be arranged in both of the first capacitor group and the second capacitor group, and the control unit, as capacity control of the capacitor bank for coarse tuning with respect to the number of capacity change stages N indicated by a frequency control signal, may perform control to turn on (a quotient of N/2) unit cells in the capacitor bank in one of the first and second capacitor groups, and turn on N−(a quotient of N/2) unit cells in the capacitor bank in the other of the first and second capacitor groups, and as capacity control of the capacitor bank for PVT compensation, with respect to the number of capacity change stages N indicated by a frequency control signal, may perform control to turn on N unit cells in the capacitor banks in both of the first and second capacitor groups.

In a case where control is performed to turn on N unit cells in the capacitor banks in both of the first and second capacitor groups with respect to the number of capacity change stages N indicated by the frequency control signal, it is necessary to reduce the capacity change amount for one unit cell to ½ in order to maintain the capacity change amount for one control stage in the case of adopting the inductor-based configuration. However, in the capacitor bank for PVT compensation, the minimum variable capacity is sufficiently larger than that of the capacitor bank for coarse tuning, that is, the capacity change amount for one unit cell is sufficiently large, and thus it is easy to reduce the capacity of each unit cell. Therefore, as described above, with respect to the capacitor bank for PVT compensation, control (referred to as "equal number control") is performed to turn on N unit cells in the capacitor banks in both of the first and second capacitor groups. Here, since the capacitor bank for PVT compensation has a large capacity change amount for one unit cell, the capacitor bank for PVT compensation is desirable in terms of phase noise suppression to apply the equal number control and not to cause a difference in the LC tank ratio regardless of the number of capacity change stages.

In addition, according to the present technology, there is provided a signal processing apparatus including: an oscillator configured to function as a transformer-based LC oscillator including a first capacitor group connected in parallel to a primary-side winding in a transformer and forming a first LC tank together with the primary-side winding, and a second capacitor group connected in parallel to a secondary-side winding in the transformer and forming a second LC tank together with the secondary-side winding, include a first type capacitor bank that is a capacitor bank having a maximum variable capacity of a predetermined value or more, and a second type capacitor bank that is a capacitor bank having a maximum variable capacity of less than the predetermined value, as capacitor banks for oscillation frequency tuning, and have the first type capacitor banks arranged in both of the first capacitor group and the second capacitor group; and a signal processing unit configured to perform signal processing on the basis of a periodic signal obtained by the oscillator.

With such a signal processing apparatus, the same effects as those of the oscillator according to the present technology described above can be obtained.

MODE FOR CARRYING OUT THE INVENTION

Hereinafter, embodiments according to the present technology will be described in the following order with reference to the accompanying drawings.
<1. Inductor-based LC Oscillator>
<2. Basic Configuration of Transformer-based LC Oscillator>
<3. Configuration of Oscillator of Embodiment>
<4. Oscillation Frequency Control Method>
<5. Application Example of Oscillator>
<6. Modification Example>
<7. Summary of Embodiments>
<8. Present Technology>

1. Inductor-Based LC Oscillator

First, an oscillator 100, that is an inductor-based LC oscillator of the related art, will be described with reference to FIG. 1.

The inductor-based LC oscillator is an oscillator that includes only a single LC tank as an LC tank (resonance circuit) and oscillates in a sine wave. The inductor-based LC oscillator is also called a class B LC oscillator because the oscillator performs oscillation by class B operation.

Figure 1:
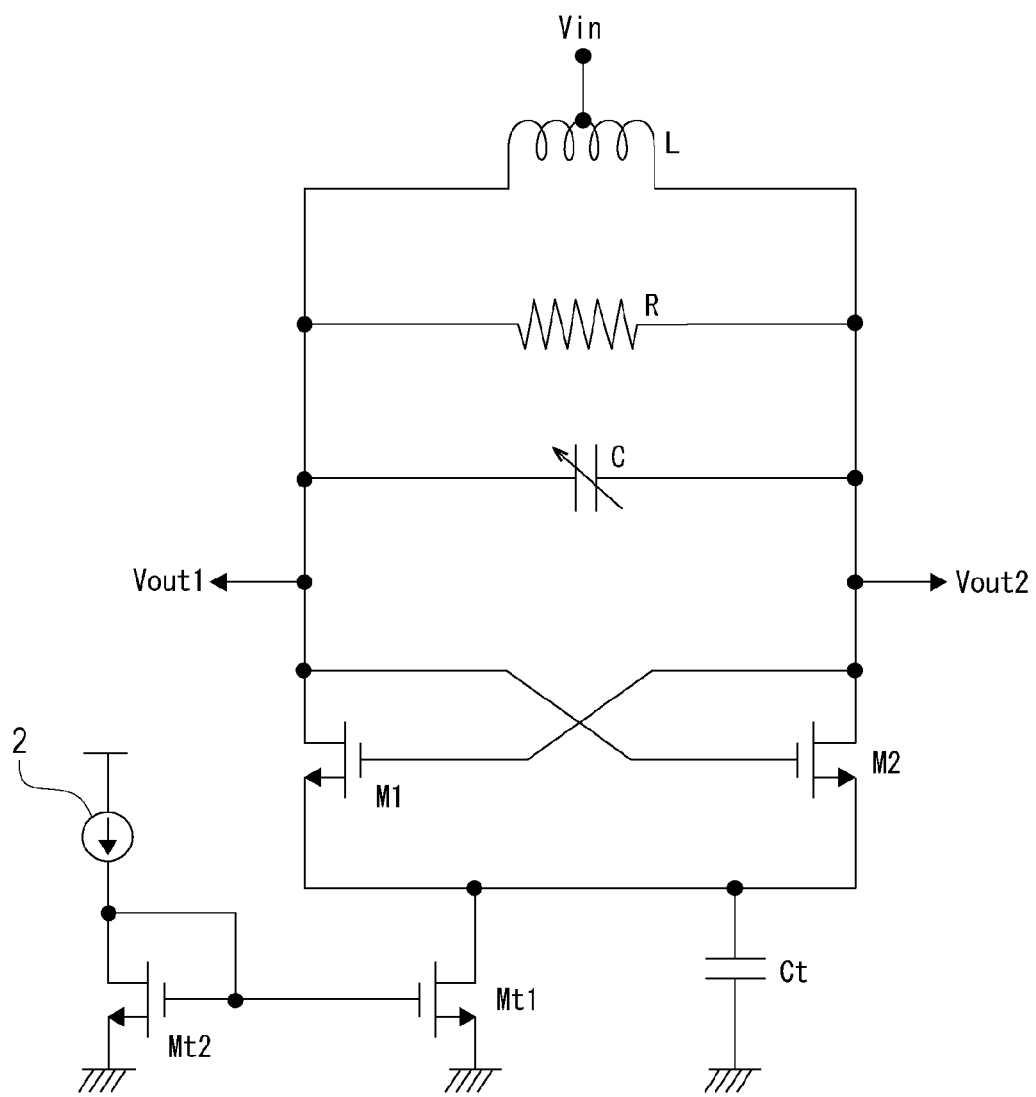
FIG. 1 is a circuit diagram for describing an inductor-based LC oscillator.

As illustrated in FIG. 1, the oscillator 100 includes an inductor L, a resistor R and a capacitor group C respectively connected in parallel to the inductor L, a transistor M1 and a transistor M2, which are cross-coupled transistors, a current source 2 constituting a circuit unit for performing tail current tuning, a transistor Mt1 and a transistor Mt2, and a capacitor Ct.

Here, "capacitor group" is an aggregate of a plurality of capacitors. For example, in a case where a specific component of the capacitor is a condenser, the capacitor group is an aggregate of a plurality of condensers.

The inductor L is center tapped, and an input voltage Vin is supplied to the center tap.

In this example, the transistors M1 and M2, which are cross-coupled transistors, are n-channel metal-oxide-semiconductor field-effect transistors (MOSFET).

As illustrated in the drawing, one ends of each of the inductor L, the resistor R, and the capacitor group C are connected to the drain of the transistor M1, and the other ends of each of the inductor L, the resistor R, and the capacitor group C are connected to the drain of the transistor M2.

The drain of the transistor M1 is connected to the gate of the transistor M2, and the drain of the transistor M2 is connected to the gate of the transistor M1. Sources of the transistors M1 and M2 are connected to each other.

The capacitor Ct is inserted between a connection point between the sources of the transistors M1 and M2 and the ground.

In this example, n-channel MOSFETs are used as the transistors Mt1 and Mt2. As illustrated in the drawing, the drain of the transistor Mt1 is connected to a connection point between the sources of the transistors M1 and M2, and the drain is grounded. The gate of the transistor Mt1 is connected to the gate of the transistor Mt2.

A drain of the transistor Mt2 is connected to the current source 2 and a source is grounded. The connection point between the gate of the transistor Mt2 and the gate of the transistor Mt1 is connected to the drain of the transistor Mt2, and accordingly, the transistors Mt1 and Mt2 constitute a current mirror circuit.

In the inductor-based oscillator 100 configured as described above, the oscillation in the sine wave is performed by the action of the LC tank (parallel resonance circuit) including the inductor L and the capacitor group C connected in parallel thereto. Here, the oscillator 100 outputs "Vout1" and "Vout2" having an opposite phase relationship as the output voltage Vout.

At this time, the capacitor group C includes, for example, a capacitor bank (capacitor bank 5) to be described later, and the capacity value can be changed. The oscillation frequency of the oscillator 100 can be tuned by changing the capacity value of the capacitor group C.

Here, as a role of the tail current source, the transconductance gm of the transistor M1 and the transistor M2 increases when the current of the transistor Mt1 in the oscillator is increased. As a result, the amplitude of the oscillation signal can be increased.

In addition, the capacitor Ct cuts noise generated from the current source 2, the transistor Mt1, and the transistor Mt2. As a result, the phase noise can be reduced.

2. Basic Configuration of Transformer-Based LC Oscillator

Figure 2:
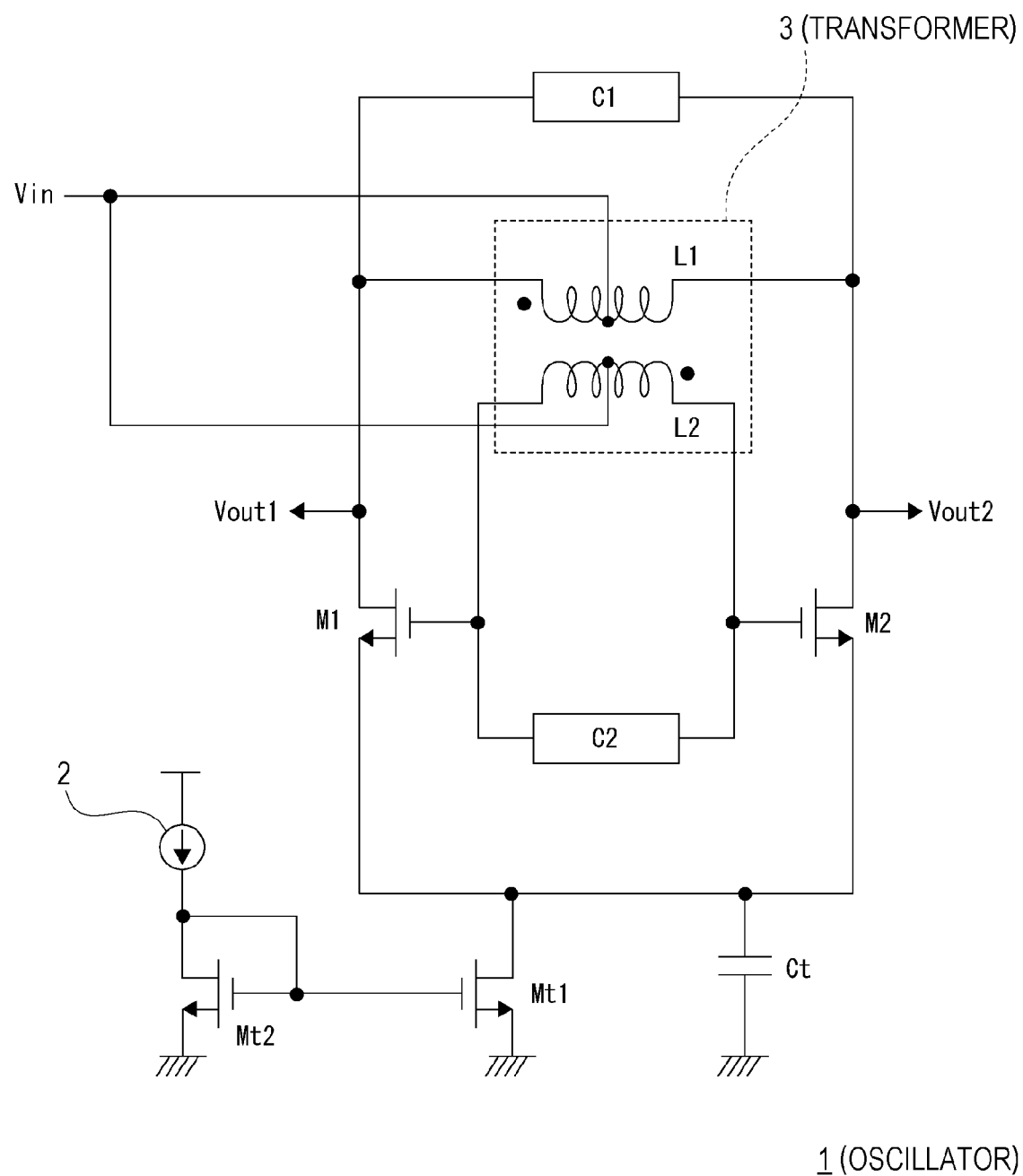
FIG. 2 is an equivalent circuit diagram illustrating a configuration example of an oscillator of an embodiment.

FIG. 2 illustrates a configuration example of the oscillator 1 of an embodiment configured as a transformer-based LC oscillator in an equivalent circuit diagram.

The oscillator 1 includes a transformer 3 having a primary-side winding as an inductor L1 and a secondary-side winding as an inductor L2. As illustrated in the drawing, a first capacitor group C1 is connected in parallel to the inductor L1, and the inductor L1 and the first capacitor group C1 form an LC tank (parallel resonance circuit) on the primary side. In addition, a second capacitor group C2 is connected in parallel to the inductor L2, and the inductor L2 and the second capacitor group C2 form an LC tank on the secondary side.

As illustrated in the drawing, a connection point between one end of the first capacitor group C1 and one end of the inductor L1 is connected to the drain of the transistor M1, and a connection point between the other end of the first capacitor group C1 and the other end of the inductor L1 is connected to the drain of the transistor M2.

Further, a connection point between one end of the inductor L2 and one end of the second capacitor group C2 is connected to the gate of the transistor M1, and a connection point between the other end of the inductor L2 and the other end of the second capacitor group C2 is connected to the gate of the transistor M2.

Sources of the transistors M1 and M2 are connected to each other, and a connection point between the sources of the transistors M1 and M2 is grounded via the capacitor Ct.

In this case, the gate of the transistor M1 and the drain of the transistor M2 are connected to each other (alternating-current connected) via the transformer 3, as are the gate of the transistor M2 and the drain of the transistor M1, and the transistors M1 and M2 function as cross-coupled transistors as in the case of FIG. 1.

In this example, the output terminal of the output voltage Vout1 is a connection point between the drain of the transistor M1 and one end of the inductor L1, and the output terminal of the output voltage Vout2 is a connection point between the drain of the transistor M2 and the other end of the inductor L1.

Note that, also in the oscillator 1, the transistors Mt1 and Mt2, which are circuit units for tail current tuning, and the current source 2 are provided similarly to the case of FIG. 1, but the operation of the circuit units is similar to that of the oscillator 100, and thus redundant description is avoided.

In addition, since the action of the capacitor Ct is similar to that of the oscillator 100, redundant description is avoided.

In the oscillator 1, which is a transformer-based LC oscillator, oscillation in the third harmonic wave can be performed by the action of two LC tanks on the primary side and the secondary side.

Figure 3:
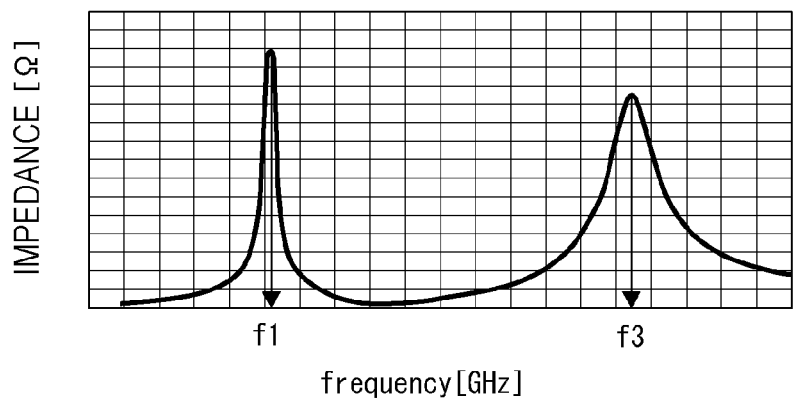
FIG. 3 is a diagram illustrating an input impedance characteristic in the oscillator according to the embodiment.

FIG. 3 exemplifies the input impedance characteristic in the oscillator 1. A peak at the frequency f1 in the drawing is a peak of the input impedance corresponding to the fundamental wave (first harmonic wave), and a peak at the frequency f3 in the drawing is a peak of the input impedance corresponding to the third harmonic wave.

Figure 4:
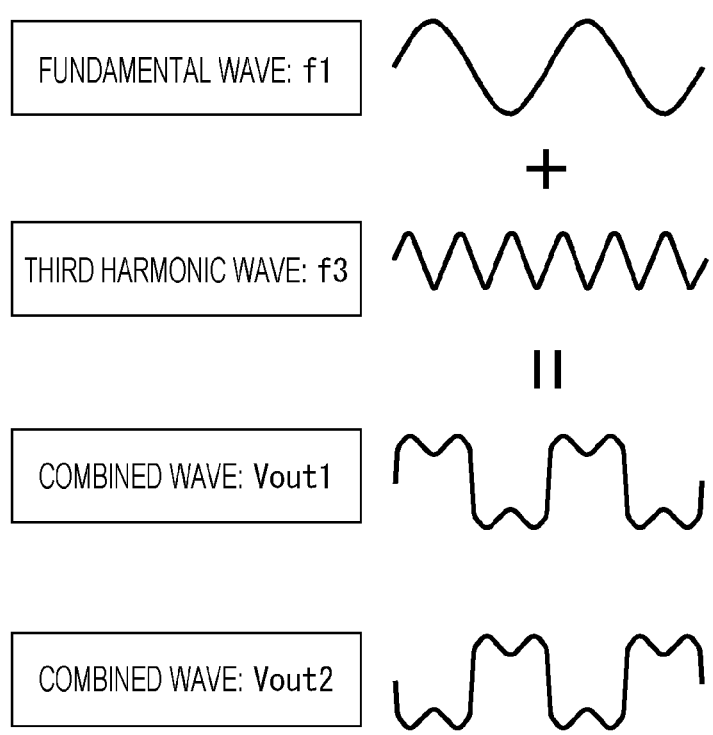
FIG. 4 is a diagram explaining a pseudo square wave.

By obtaining such an input impedance characteristic, in the oscillator 1, which is a transformer-based LC oscillator, as illustrated as a combined wave (Vout1, Vout2) in FIG. 4, oscillation in a pseudo square wave obtained by adding the third harmonic wave (f3) to the fundamental wave (f1) can be performed.

Since the pseudo square wave can increase the inclination of the zero-cross point with respect to the sine wave, an error in the zero-cross timing, that is, a phase error (phase noise) of the oscillation signal, can be suppressed as compared with the inductor-based oscillator 100.

A transformer-based LC oscillator is also called a class F LC oscillator because the oscillator performs oscillation by class F operation.

The oscillation frequency f in the transformer-based LC oscillator is expressed by the following [Formula 1].

[Math. 1]
$$f = \frac{1}{2\pi\sqrt{Lp \times c1 + Ls \times c2}}$$ [Formula 1]

Here, Lp and Ls respectively represent inductance of the primary-side LC tank (inductance of the inductor L1) and inductance of the secondary-side LC tank (inductance of the inductor L2), and c1 and c2 respectively represent capacitance (capacity value) of the first capacitor group C1 and capacitance of the second capacitor group C2.

Here, the transformer-based oscillator 1 having the configuration described with reference to FIG. 2 can also adopt a configuration including a capacitor bank for tuning the oscillation frequency. The capacitor bank is a circuit configured to be able to change a capacity value. Hereinafter, the capacitor bank will be referred to as "capacitor bank 5" with the reference sign "5".

Figure 5:
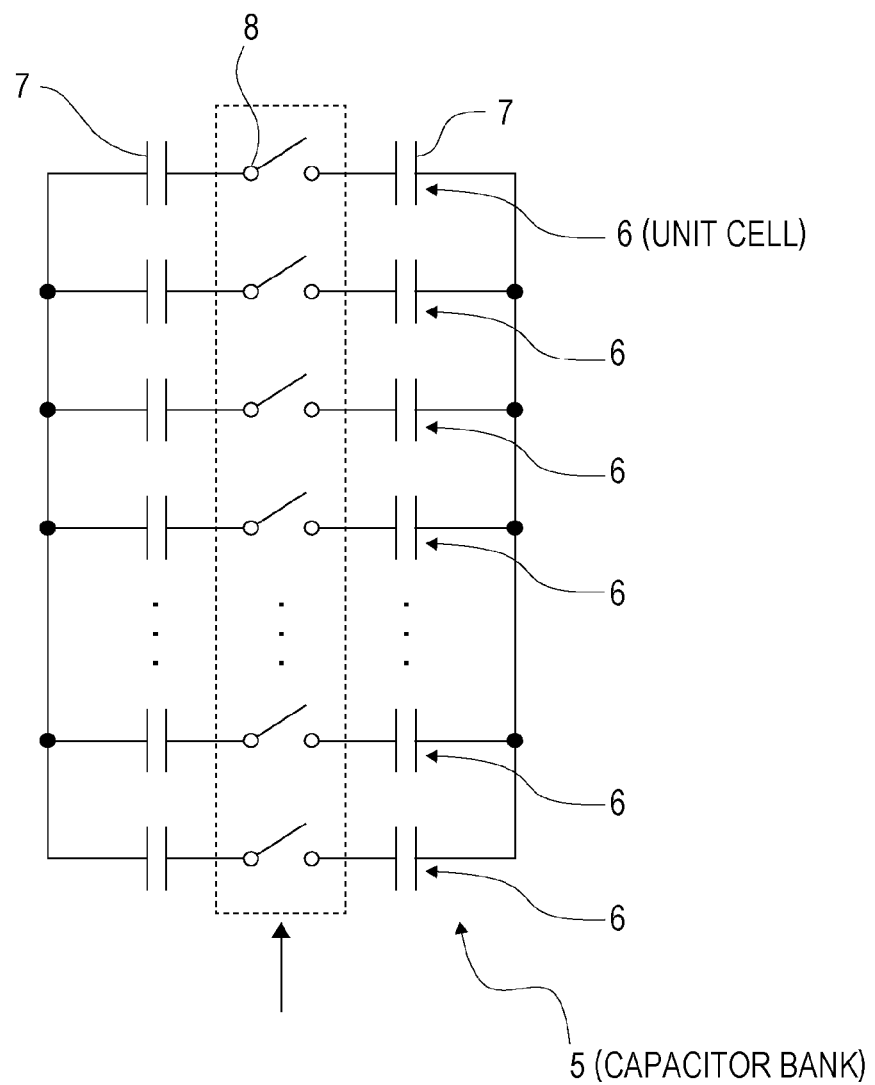
FIG. 5 is an equivalent circuit diagram illustrating a configuration example of a capacitor bank.

FIG. 5 is an equivalent circuit diagram illustrating a configuration example of the capacitor bank 5.

As illustrated in the drawing, the capacitor bank 5 has a configuration in which a plurality of unit cells 6 is connected in parallel.

The unit cell 6 constitutes a minimum unit of a variable capacity in the capacitor bank 5, and can be equivalently represented as a configuration in which a capacitor 7 and a switch unit 8 are connected in series as illustrated in the drawing. In the example of this drawing, the unit cell 6 has two capacitors 7, and the two capacitors 7 are electrically connected when the switch unit 8 is turned on.

In the unit cell 6, the on/off state of the unit cell 6 is switched with the on/off switching of the switch unit 8. The on state and the off state of the unit cell 6 can be defined as a state where the capacity value of the unit cell 6 is "large" and a state where the capacity value of the unit cell 6 is "small", respectively. In the equivalent circuit exemplified in FIG. 5, when the switch unit 8 is turned off and the unit cell 6 is in the off state, the capacity value of the unit cell 6 is "0", and when the switch unit 8 is turned on and the unit cell 6 is in the on state, the capacity value of the unit cell 6 is the total capacity value of the two capacitors 7.

In the capacitor bank 5 in which a plurality of such unit cells 6 is connected in parallel, the capacity value can be changed by changing the number of unit cells 6 to be turned on under the control of the switch unit 8.

Here, as disclosed in Non-Patent Document 1 mentioned above, in the transformer-based LC oscillator in the related art, the capacitor bank 5 as described above is arranged only in one of the first capacitor group C1 and the second capacitor group C2 in order to make it possible to tune the oscillation frequency. Specifically, in Non-Patent Document 1, a capacitor bank for coarse tuning of an oscillation frequency is arranged only in the second capacitor group C2.

However, in this configuration, the LC tank ratio X between the two LC tanks on the primary side and the secondary side changes according to the change in capacity value of the capacitor bank due to the frequency tuning. The LC tank ratio X is a value obtained by "X=Ls·c2/(Lp·c1)" when inductances in the LC tanks on the primary side and the secondary side are denoted by Lp and Ls, respectively, and capacity values (capacitances) of the capacitor groups on the primary side and the secondary side are denoted by c1 and c2, respectively.

When the LC tank ratio X changes, as the input impedance characteristic of the oscillator, the peak position of the input impedance corresponding to the third harmonic wave deviates from the expected position (frequency), and the peak amplitude decreases. As a result, the waveform of the pseudo square wave collapses, leading to an increase in phase noise.

3. Configuration of Oscillator of Embodiment

Therefore, in the oscillator 1 of the present embodiment, a configuration in which the capacitor banks 5 for oscillation frequency tuning are arranged in both of the first capacitor group C1 and the second capacitor group C2 is adopted.

Here, as disclosed in Non-Patent Document 1, for the oscillation frequency tuning, coarse tuning, which is rough frequency tuning for performing frequency band switching and the like, and fine tuning, which is frequency tuning with higher accuracy for adjusting to a target frequency such as a center frequency within a selected frequency band, may be performed.

At this time, the frequency variable range of the coarse tuning is considerably wider than the frequency variable range of the fine tuning. In other words, the maximum variable capacity of the capacitor bank 5 used for the coarse tuning is considerably larger than the maximum variable capacity of the capacitor bank 5 used for the fine tuning.

Here, the maximum variable capacity is the maximum variable amount of the capacity in the capacitor bank 5, and can also be called the difference amount of the capacity value between the case where all the unit cells 6 are turned on and the case where all the unit cells 6 are turned off in the capacitor bank 5.

In addition, in the fine tuning, the resolution of the frequency should be higher than that in the coarse tuning. Therefore, the minimum variable capacity of the capacitor bank 5 for fine tuning is considerably smaller than the minimum variable capacity of the capacitor bank 5 for coarse tuning. The minimum variable capacity is a minimum variable amount of the capacity in the capacitor bank 5, and can also be called a variable capacity per unit cell 6.

Hereinafter, the capacitor bank 5 for coarse tuning will be referred to as a "coarse tuning capacitor bank 5a", and the capacitor bank 5 for fine tuning will be referred to as a "fine tuning capacitor bank 5c".

Figure 6:
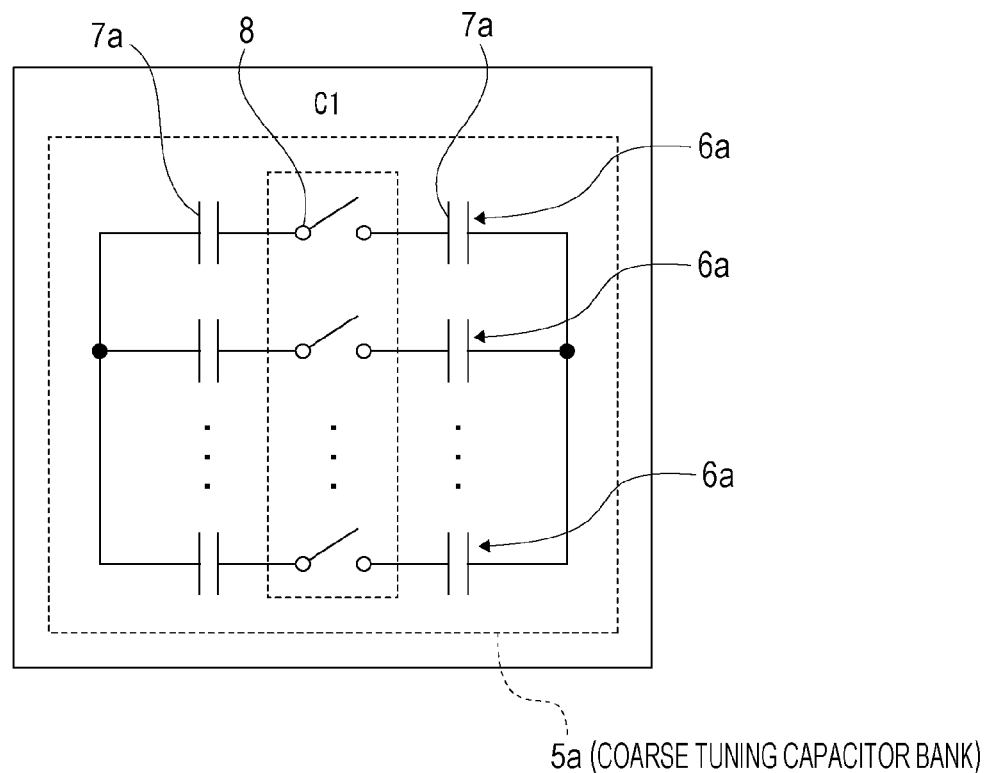
FIG. 6 is a diagram for describing arrangement of capacitor banks for coarse tuning in the embodiment.
Figure 6:
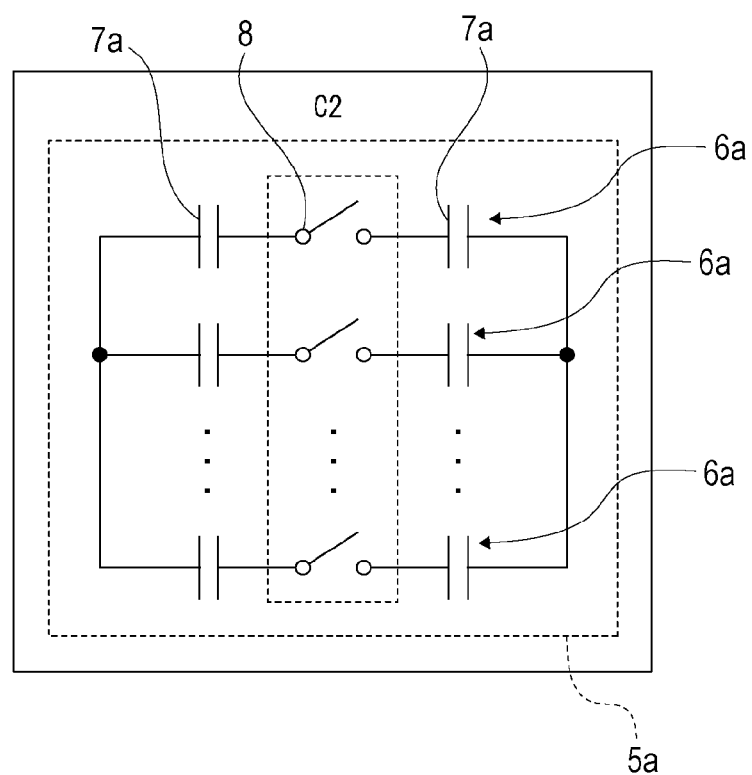

As illustrated in FIG. 6, in the oscillator 1 of the present embodiment, a configuration in which the coarse tuning capacitor banks 5a out of the coarse tuning capacitor bank 5a and the fine tuning capacitor bank 5c are arranged in both of the first capacitor group C1 and the second capacitor group C2 is adopted.

As illustrated in the drawing, the unit cell 6 and the capacitor 7 included in the coarse tuning capacitor bank 5a are denoted as "unit cell 6a" and "capacitor 7a", respectively.

In this example, the number of unit cells 6a is the same in the coarse tuning capacitor bank 5a arranged in the first capacitor group C1 and the coarse tuning capacitor bank 5a arranged in the second capacitor group C2.

Here, as described above, a configuration in which the coarse tuning capacitor banks 5a out of the coarse tuning capacitor bank 5a and the fine tuning capacitor bank 5c are arranged in both of the first capacitor group C1 and the second capacitor group C2 can also be called a configuration in which the first type capacitor banks out of the first type capacitor bank that is a capacitor bank having a maximum variable capacity of a predetermined value or more and the second type capacitor bank that is a capacitor bank having a maximum variable capacity of less than a predetermined value are arranged in both of the first capacitor group C1 and the second capacitor group C2.

As described for confirmation, the reason why the coarse tuning capacitor banks 5a having the maximum variable capacity larger than that of the fine tuning capacitor bank 5c are arranged in both of the first capacitor group C1 and the second capacitor group C2 as described above is that even when the fine tuning capacitor bank 5c having a small maximum variable capacity is arranged in only one of the first capacitor group C1 and the second capacitor group C2, the change in the LC tank ratio X accompanying the frequency tuning (capacity control) is minute, and the influence on the phase noise is also minute, whereas in a case where the coarse tuning capacitor bank 5a is arranged in only one of the first capacitor group C1 and the second capacitor group C2, the change amount in the LC tank ratio X accompanying the frequency tuning is large, and the deterioration of the phase noise cannot be ignored.

By arranging the coarse tuning capacitor banks 5a in both of the first capacitor group C1 and the second capacitor group C2 as described above, it is possible to prevent the LC tank ratio X from changing even when the capacity value of the capacitor bank changes, and it is possible to suppress collapse of the oscillation waveform accompanying the oscillation frequency tuning and to suppress the phase noise.

Here, examples of the capacity control using the capacitor bank 5 include not only the capacity control for coarse tuning and fine tuning described above but also capacity control for process voltage temperature (PVT) compensation. That is, the capacity control is for compensating for variations in oscillation frequency due to process errors, input voltage variations, and temperature variations.

Hereinafter, the capacitor bank 5 used for such PVT compensation is referred to as a "PVT capacitor bank 5b".

The PVT capacitor bank 5b has the largest minimum variable capacity as compared with the coarse tuning capacitor bank 5a and the fine tuning capacitor bank 5c described above. That is, the variable capacity per unit cell 6 is the largest.

In the oscillator 1 of the present embodiment, such PVT capacitor banks 5b are also arranged in both of the first capacitor group C1 and the second capacitor group C2.

Figure 7:
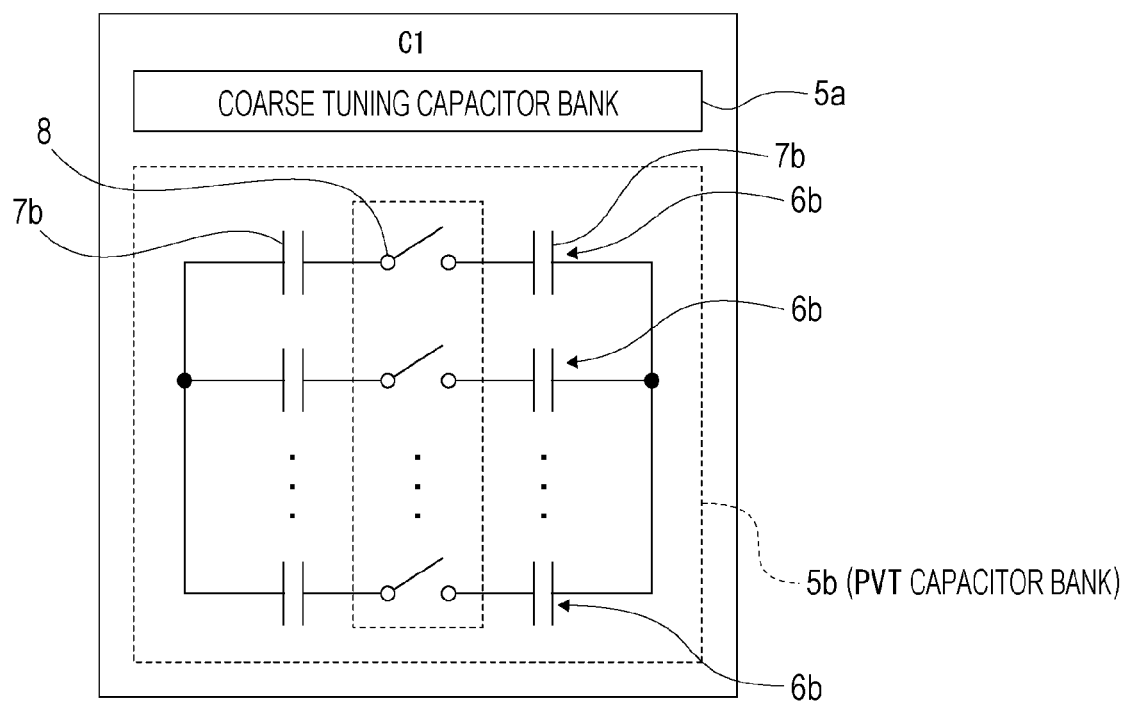
FIG. 7 is a diagram for describing arrangement of capacitor banks for PVT compensation in the embodiment.
Figure 7:
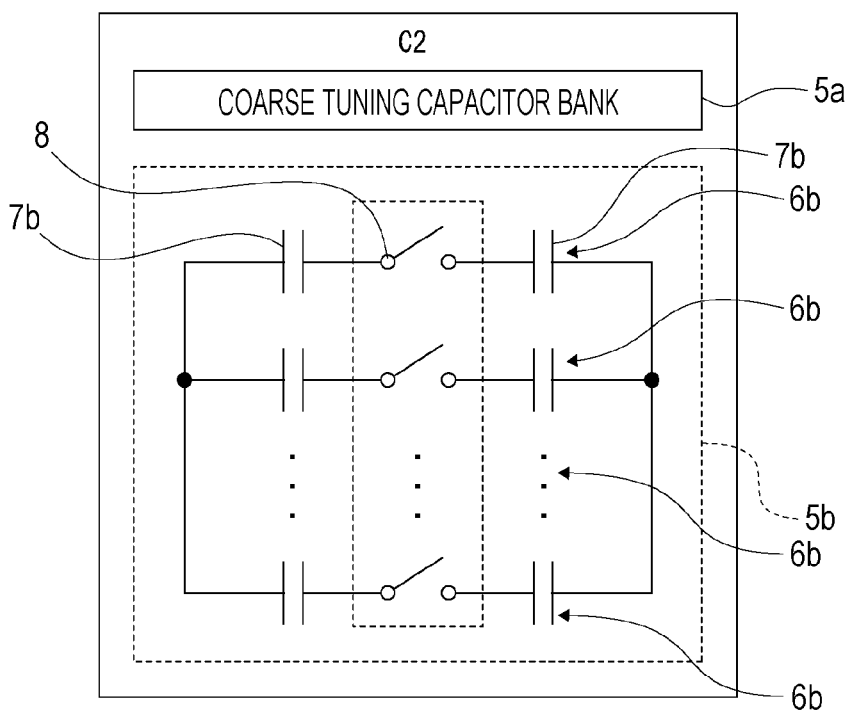

Specifically, as illustrated in FIG. 7, not only the coarse tuning capacitor banks 5a but also the PVT capacitor banks 5b are arranged in both of the first capacitor group C1 and the second capacitor group C2. As illustrated in the drawing, the unit cell 6 and the capacitor 7 included in the PVT capacitor bank 5b are denoted as "unit cell 6b" and "capacitor 7b", respectively.

In this example, the number of unit cells 6b is the same in the PVT capacitor bank 5b arranged in the first capacitor group C1 and the PVT capacitor banks 5b arranged in the second capacitor group C2.

By arranging the PVT capacitor banks 5b in both of the first capacitor group C1 and the second capacitor group C2, it is possible to prevent the LC tank ratio X from changing according to the capacity change for PVT compensation, and it is possible to suppress the phase noise.

Note that the capacity control for PVT compensation is performed before execution of coarse tuning or fine tuning. That is, first, capacity control using the PVT capacitor bank 5b is performed for PVT compensation, and then coarse tuning and fine tuning using the coarse tuning capacitor bank 5a and the fine tuning capacitor bank 5c are performed.

Here, the fine tuning capacitor banks 5c may be arranged in both of the first capacitor group C1 and the second capacitor group C2, or may be arranged in only one of the first capacitor group C1 and the second capacitor group C2.

Figure 8:
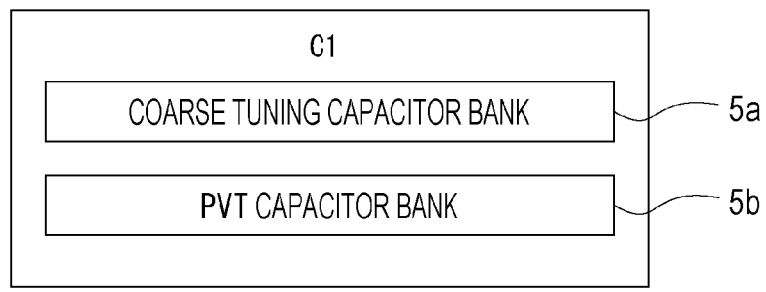
FIG. 8 is a diagram explaining an example in which a capacitor bank for fine tuning is arranged on the second capacitor group side.
Figure 8:
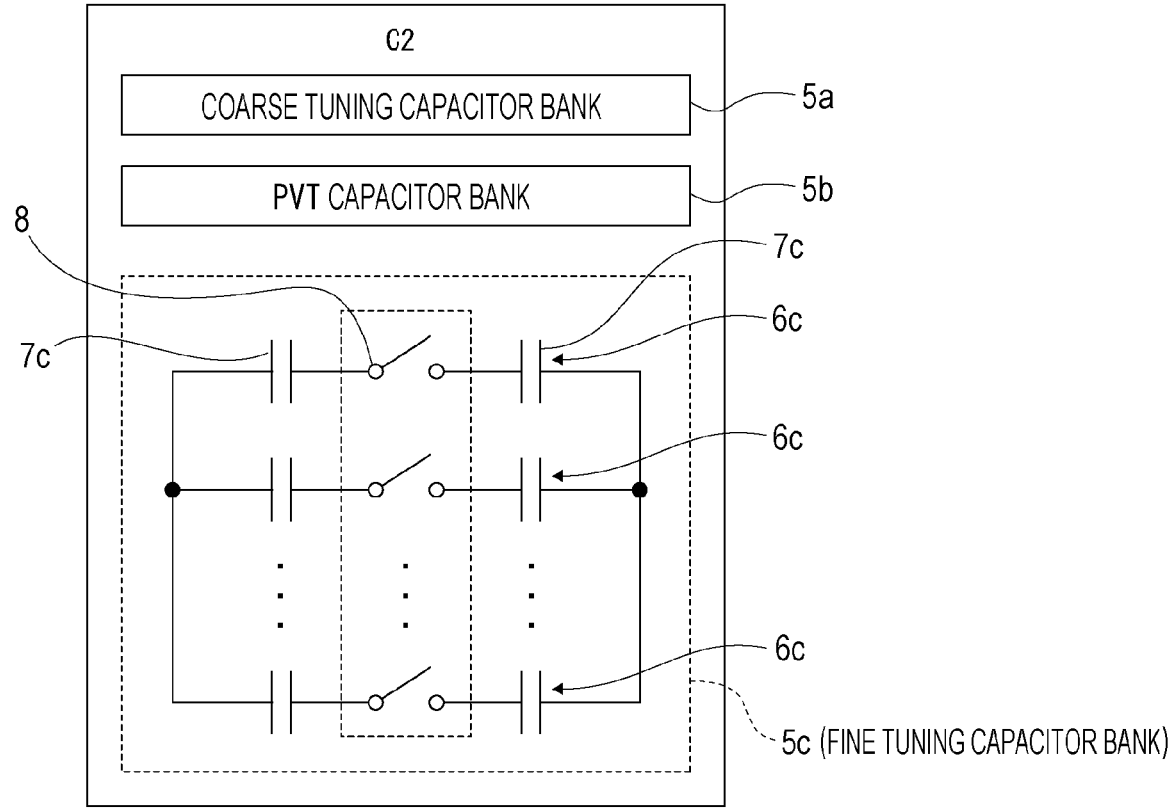

As an example, the fine tuning capacitor bank 5c can be arranged only on the second capacitor group C2 side as illustrated in FIG. 8.

As illustrated in the drawing, the unit cell 6 and the capacitor 7 included in the fine tuning capacitor bank 5c are denoted as "unit cell 6c" and "capacitor 7c", respectively.

Figure 9:
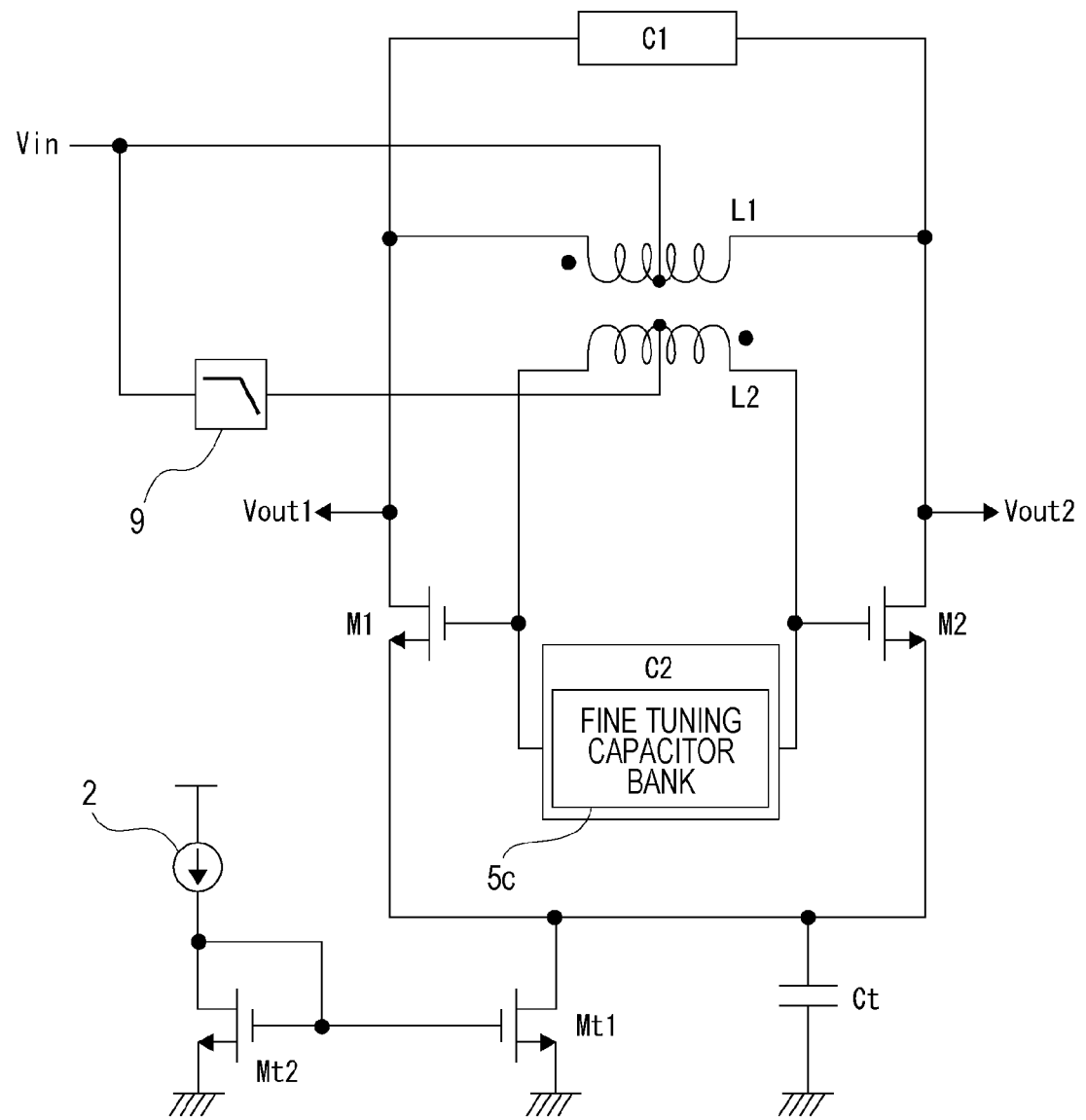
FIG. 9 is an equivalent circuit diagram illustrating a configuration example of an oscillator in a case where a capacitor bank for fine tuning is arranged on the second capacitor group side.

By adopting a configuration in which the fine tuning capacitor bank 5c is arranged only on the second capacitor group C2 side, as illustrated in the equivalent circuit diagram of FIG. 9, the fine tuning capacitor bank 5c is inserted between the gates of the transistors M1 and M2 as the cross-coupled transistors.

Therefore, as illustrated in FIG. 9, a power supply filter 9 is inserted into the power supply line to the second capacitor group C2 side, and accordingly, the influence of power supply noise can be suppressed in fine tuning of the oscillation frequency using the fine tuning capacitor bank 5c. That is, the accuracy of fine tuning of the oscillation frequency can be improved.

Alternatively, the fine tuning capacitor bank 5c can be arranged only on the first capacitor group C1 side.

Figure 10:
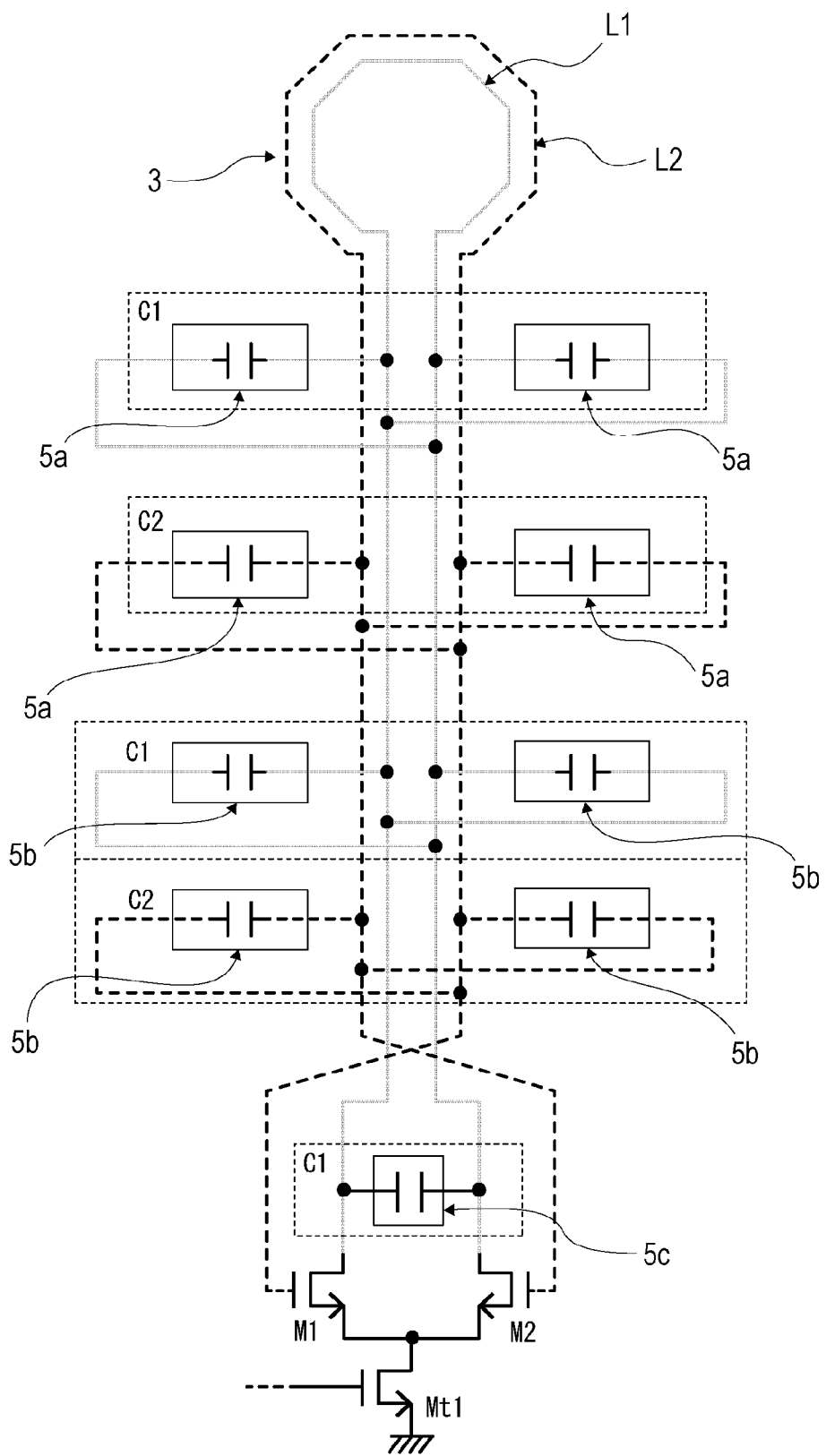
FIG. 10 is a diagram schematically illustrating a layout of a main part of the oscillator in a case where a capacitor bank for fine tuning is arranged on the first capacitor group side in a plan view.

FIG. 10 schematically illustrates a layout of a main part of the oscillator 1 in a case where the fine tuning capacitor bank 5c is arranged only on the first capacitor group C1 side in a plan view. Specifically, the example of the layout of the transformer 3 including the inductors L1 and L2, the first capacitor group C1 and the second capacitor group C2, and the transistors M1, M2, and Mt1 is illustrated.

In the oscillator 1 in this case, in the transformer 3, the primary-side winding as the inductor L1 is arranged inside the secondary-side winding as the inductor L2.

As illustrated in the drawing, the fine tuning capacitor bank 5c in this case has one end connected to one end of the inductor L1, has the other end connected to the other end of the inductor L1, and constitutes a part of the first capacitor group C1. In other words, the fine tuning capacitor bank 5c is arranged as a part of the first capacitor group C1.

By arranging the fine tuning capacitor bank 5c on the first capacitor group C1 side, it is possible to add capacity to the first capacitor group C1 corresponding to a case where the primary-side winding of the transformer 3 is arranged inside the secondary-side winding, that is, a case where the inductance of the primary-side winding is smaller than the inductance of the secondary-side winding.

Therefore, the change in the LC tank ratio X can be suppressed, and the phase noise can be suppressed.

Here, as illustrated in the layout diagram of FIG. 10, in the oscillator 1 in this case, the capacitor bank 5 in the first capacitor group C1 and the capacitor bank 5 in the second capacitor group C2 are arranged adjacent to each other in a plan view.

Specifically, in the illustrated example, the arrangement positions of the first capacitor group C1 and the second capacitor group C2 are divided into a part in which only the coarse tuning capacitor bank 5a is arranged and a part in which only the PVT capacitor bank 5b is arranged, but the coarse tuning capacitor bank 5a in the first capacitor group C1 and the coarse tuning capacitor bank 5a in the second capacitor group C2 are arranged adjacent to each other in a plan view. Similarly, the PVT capacitor bank 5b in the first capacitor group C1 and the PVT capacitor bank 5b in the second capacitor group C2 are arranged adjacent to each other in a plan view.

Here, arranging two capacitor banks 5 adjacent to each other means that the capacitor banks 5 are arranged without interposing another element therebetween.

Since the capacitor bank 5 in the first capacitor group C1 and the capacitor bank 5 in the second capacitor group C2 are arranged adjacent to each other as described above, it is possible to prevent occurrence of a mismatch in capacity resolution between the capacitor bank 5 in the first capacitor group C1 and the capacitor bank 5 in the second capacitor group C2.

Here, in the example of FIG. 10, the set of the coarse tuning capacitor bank 5a in the first capacitor group C1 and the coarse tuning capacitor bank 5a in the second capacitor group C2 in the adjacent arrangement relationship is similarly arranged closer to the transformer 3 than the set of the PVT capacitor bank 5b in the first capacitor group C1 and the PVT capacitor bank 5b in the second capacitor group C2 in the adjacent arrangement relationship, but conversely, the latter set may be arranged closer to the transformer 3 than the former set.

In addition, in the example of FIG. 10, for each of the coarse tuning capacitor bank 5a and the PVT capacitor bank 5b, the capacitor bank 5 on the first capacitor group C1 side is arranged on the side farther from the transformer 3 than the capacitor bank 5 on the second capacitor group C2 side. On the other hand, the arrangement positional relationship between the capacitor bank 5 on the first capacitor group C1 side and the capacitor bank 5 on the second capacitor group C2 side is not limited to that illustrated in FIG. 10, for example, the capacitor bank 5 on the second capacitor group C2 side may be arranged on the side farther from the transformer 3 than the capacitor bank on the first capacitor group C1 side.

In addition, in the example of FIG. 10, the fine tuning capacitor bank 5c as a part of the first capacitor group C1 is arranged at a position farther away from the transformer 3 than any other capacitor bank 5 (that is, the coarse tuning capacitor bank 5a and the PVT capacitor bank 5b in this example), but the arrangement position of the fine tuning capacitor bank 5c is not limited thereto.

In addition, the arrangement of each of the capacitor banks 5 described above is not limited to the case where the fine tuning capacitor bank 5c is arranged only in the first capacitor group C1, and can also be applied to the case where the fine tuning capacitor bank 5c is arranged only in the second capacitor group C2, the case where the fine tuning capacitor bank 5c is arranged in both of the first capacitor group C1 and the second capacitor group C2, and the like.

4. Oscillation Frequency Control Method

Next, a method of controlling the oscillation frequency will be described with reference to FIGS. 11 to 13.

Figure 11:
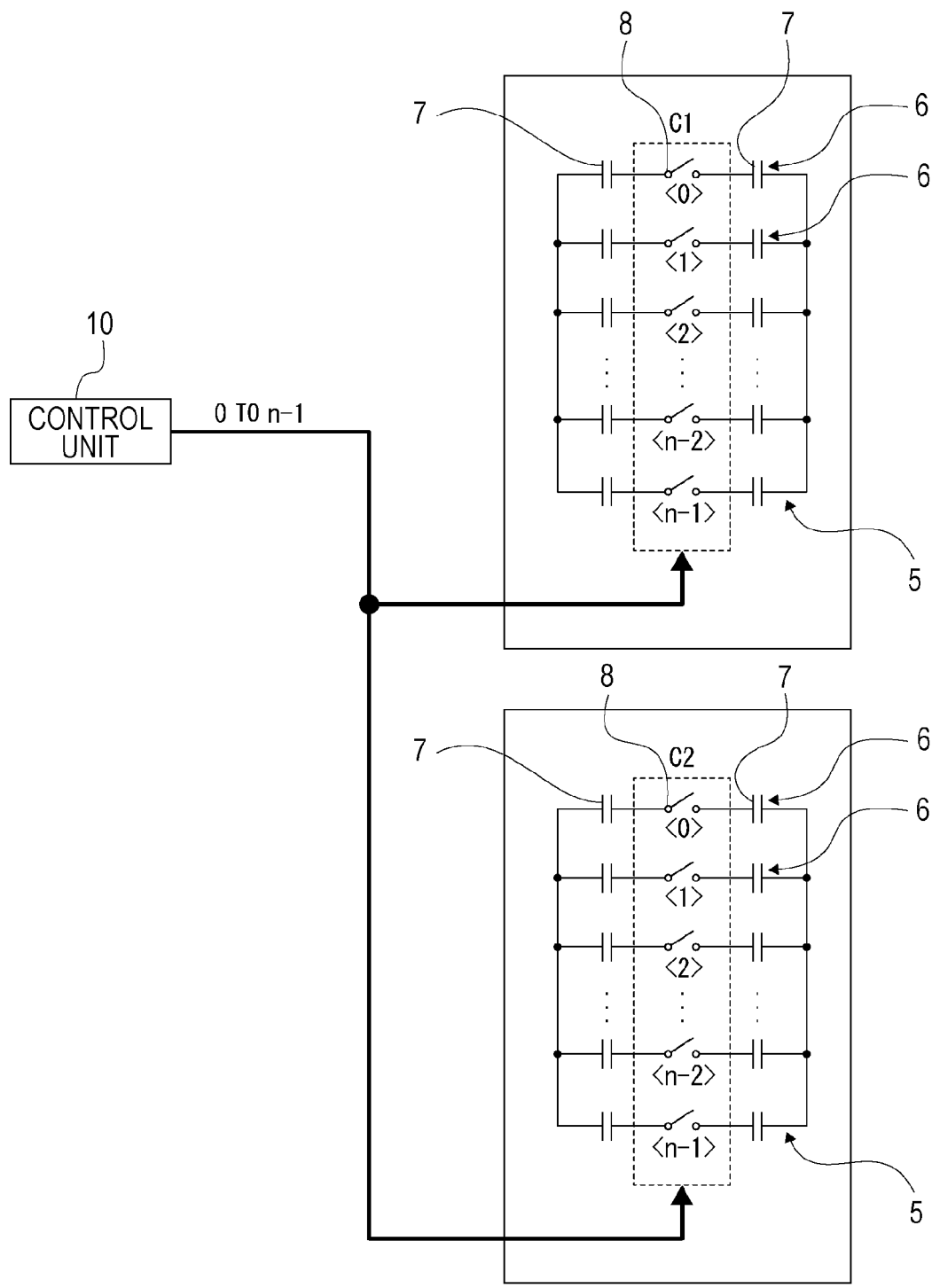
FIG. 11 is a diagram explaining oscillation frequency control (capacity control) as equal number control.
Figure 12:
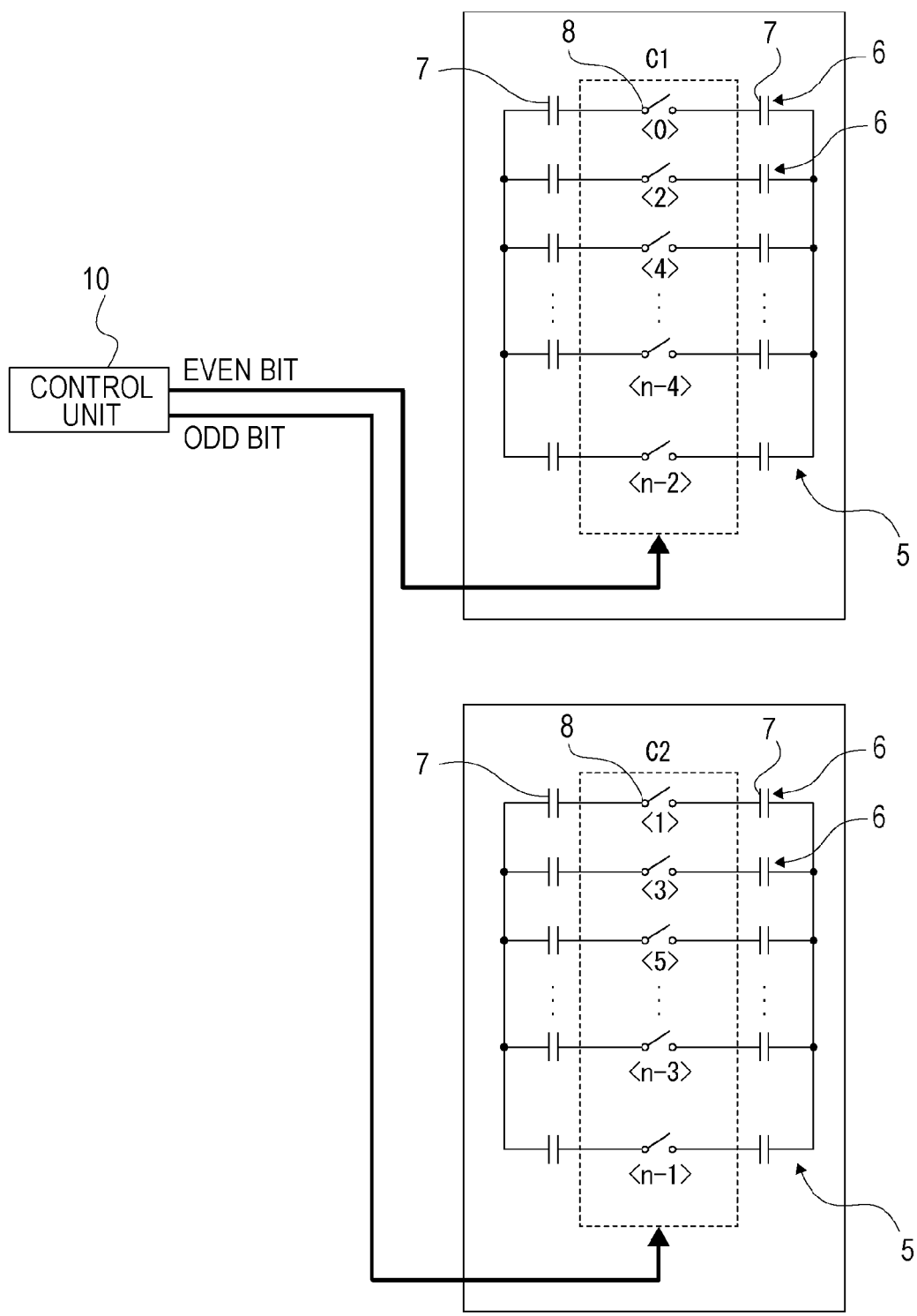
FIG. 12 is a diagram explaining oscillation frequency control (capacity control) as alternate control.

Examples of the oscillation frequency control method of the oscillator 1 in which the capacitor banks 5 are arranged in both of the first capacitor group C1 and the second capacitor group C2 include the equal number control illustrated in FIG. 11 and the alternate control illustrated in FIG. 12.

In the case where control of the oscillation frequency is performed, the oscillator 1 is provided with a control unit 10 that performs on/off control of the unit cell 6 on the basis of the frequency control signal.

Here, the frequency control signal is a signal indicating the number of capacity change stages. The number of capacity change stages is the number of capacity change stages in the oscillation frequency tuning, and the amount of change of the capacity for one stage is the change amount corresponding to the minimum variable amount of the frequency in the oscillation frequency tuning.

Here, the number of capacity change stages indicated by the frequency control signal is N (N is an integer of 0 or more).

The equal number control is control of turning on N unit cells 6 in the capacitor banks 5 of both of the first capacitor group C1 and the second capacitor group C2 with respect to the number of capacity change stages N indicated by the frequency control signal.

In a case where the equal number control is performed, n (the maximum value of the number of capacity change stages N) unit cells 6 are provided in each of the capacitor banks 5 of the first capacitor group C1 and the second capacitor group C2 (in the drawing, unit cells 6 of <0> to <n−1>).

In this case, the frequency control signal includes a plurality of control bits, and each control bit is a signal indicating the presence or absence of a capacity change for one stage. For example, when the number of capacity change stages N=3, the frequency control signal is a signal in which the 0th to second control bit values are "1" and the third and subsequent control bit values are "0".

In a case where the equal number control is performed, the control unit 10 uses the value of each control bit in such a frequency control signal as the on/off control signal for each unit cell 6 of each capacitor bank 5 to control the on/off state of each unit cell 6. Specifically, the capacity control is performed using the value of each control bit as the on/off control signal for each unit cell 6 of each capacitor bank 5, such that the on/off control of the switch unit 8 of the 0th unit cell 6 in each capacitor bank 5 is performed according to the 0th control bit value, and the on/off control of the switch unit 8 of the first unit cell 6 in each capacitor bank 5 is performed according to the first control bit value.

According to such equal number control, since the number of unit cells 6 in the on state on the first capacitor group C1 side and the second capacitor group C2 side can be made equal in the tuning of the oscillation frequency, there is an advantage that it is possible to prevent the LC tank ratio X from changing with the change of the oscillation frequency, that is, it is possible to prevent the deterioration of the phase noise due to the change of the oscillation frequency.

Next, the alternate control illustrated in FIG. 12 will be described.

The alternate control is control in which (a quotient of N/2) unit cells 6 in the capacitor bank 5 in one of the first capacitor group C1 and the second capacitor group C2 are turned on and N−(a quotient of N/2) unit cells in the capacitor bank 5 in the other of the first capacitor group C1 and the second capacitor group C2 are turned on, with respect to the number of capacity change stages N indicated by the frequency control signal. Specifically, for example, when N=3, control is performed such that one unit cell 6 is turned on in the capacitor bank 5 in one of the first capacitor group C1 and the second capacitor group C2, and two unit cells 6 are turned on in the capacitor bank 5 in the other of the first capacitor group C1 and the second capacitor group C2. Further, for example, when N=4, control is performed to turn on the two unit cells 6 in each of the capacitor banks 5 of both of the first capacitor group C1 and the second capacitor group C2.

According to such control, in a case where the number of capacity change stages N increases (or decreases) by one, it is possible to control a mode in which the unit cells 6 are alternately turned on (or off) between the capacitor bank 5 on the first capacitor group C1 side and the capacitor bank 5 on the second capacitor group C2 side, which is referred to as "alternate control" here.

In the above-described equal number control in FIG. 11, n unit cells 6 are arranged in each of the first capacitor group C1 and the second capacitor group C2. On the other hand, in a case where the alternate control is performed, a total of n unit cells 6 are arranged in the first capacitor group C1 and the second capacitor group C2. In other words, n/2 unit cells 6 are arranged respectively on the first capacitor group C1 side and the second capacitor group C2 side in this case.

Then, in the alternate control in this case, among the n control bits from 0 to n−1 included in the frequency control signal, the even-numbered bit (hereinafter denoted as "even bit") is allocated as the control bit of each unit cell 6 of the capacitor bank 5 in one of the first capacitor group C1 and the second capacitor group C2, and the odd-numbered bit (hereinafter denoted as "odd bit") is allocated as the control bit of each unit cell 6 of the capacitor bank 5 in the other of the first capacitor group C1 and the second capacitor group C2. Specifically, in the illustrated example, the even bit side of the frequency control signal is allocated as the control bit of each unit cell 6 of the capacitor bank 5 in the first capacitor group C1, and the odd bit side is allocated as the control bit of each unit cell 6 of the capacitor bank 5 in the second capacitor group C2.

In this case, the control unit 10 performs on/off control of each unit cell 6 according to the allocation of the control bits as described above. Specifically, on/off control of each unit cell 6 on the first capacitor group C1 side is performed according to the even bits of the control bits, and on/off control of each unit cell 6 on the second capacitor group C2 side is performed according to the odd bits of the control bits.

In the above alternate control, depending on the number of capacity change stages N, the number of unit cells 6 in the on state between the first capacitor group C1 and the second capacitor group C2 does not match. However, since the difference is suppressed by one unit cell 6, the change amount of the LC tank ratio X is minute. That is, there is no change in that the phase noise can be suppressed.

Here, in the equal number control described above, the capacity change amount for one control stage is twice the variable capacity for one unit cell 6. Therefore, in order to maintain the capacity change amount for one control stage in the case of adopting the inductor-based configuration, it is necessary to reduce the variable capacity for one unit cell 6 to ½. However, depending on the type of the capacitor bank 5, it may be difficult to reduce the variable capacity for one unit cell 6. For example, in the coarse tuning capacitor bank 5a, since the capacity change amount of each unit cell 6a is originally small, it is practically difficult to reduce the capacity change amount for one unit cell 6a to ½. That is, it is difficult to realize a transformer-based LC oscillator in which the capacitor banks 5 are arranged in both of the first capacitor group C1 and the second capacitor group C2.

On the other hand, according to the alternate control, the capacity change amount for one control stage, that is, the capacity change amount of each unit cell 6 can be made equal to the case of adopting the inductor-based configuration. Therefore, it is possible to facilitate realization of a transformer-based LC oscillator in which the capacitor banks 5 are arranged in both of the first capacitor group C1 and the second capacitor group C2.

In addition, even in a case where the equal number control is performed, when the inductance is set to ½, the capacity change amount of each unit cell 6 can be made equal to that in the case of adopting the inductor-based configuration, but in this case, the oscillation amplitude greatly decreases, and the generation of the phase noise caused by the decrease in amplitude is induced.

Figure 13:
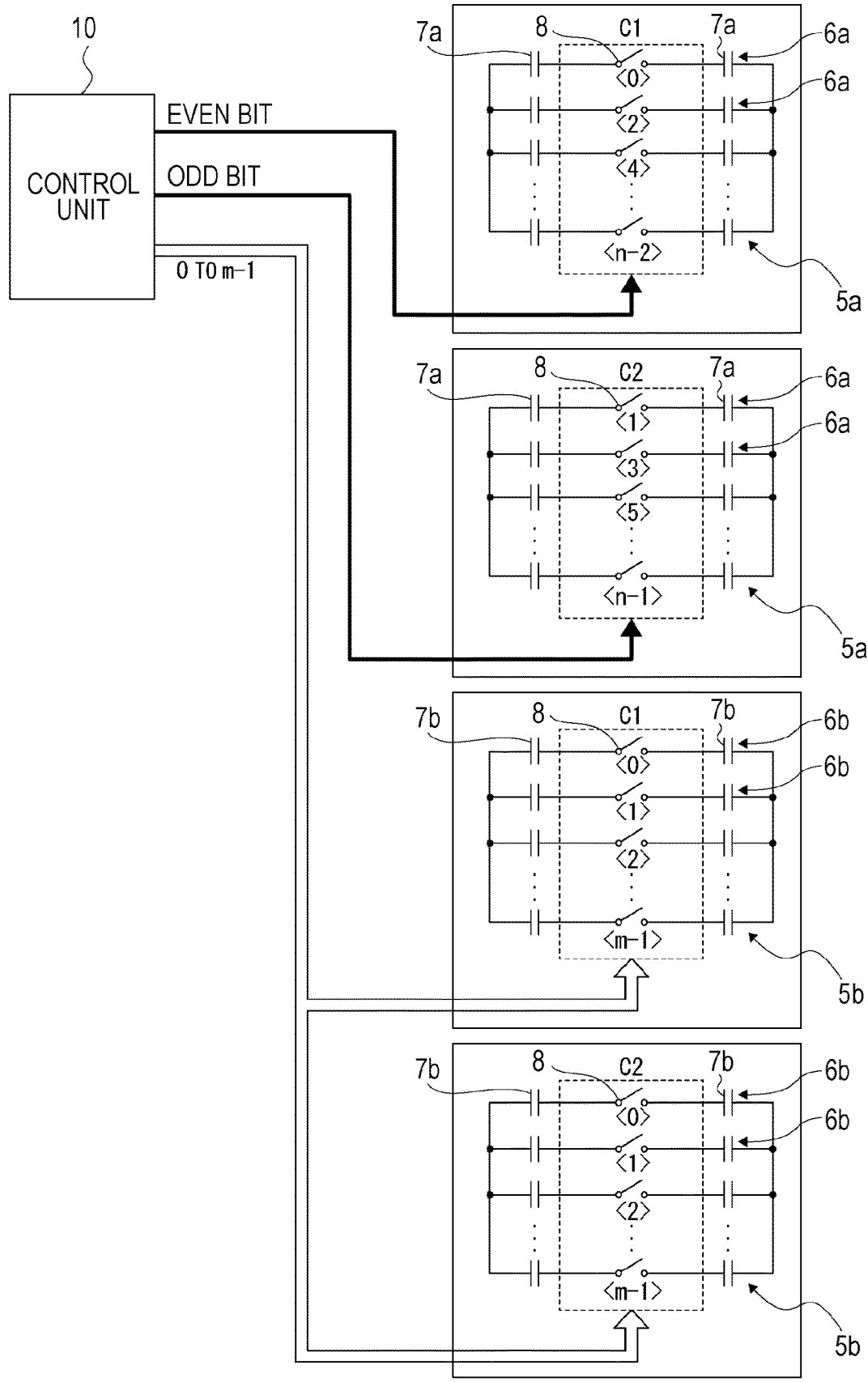
FIG. 13 is a diagram explaining an actual application example of the equal number control and the alternate control.

FIG. 13 is a diagram explaining an actual application example of the equal number control and the alternate control.

As described above, in the oscillator 1 of the present example, the coarse tuning capacitor banks 5a and the PVT capacitor banks 5b are arranged in both of the first capacitor group C1 and the second capacitor group C2, respectively. However, in this case, it is conceivable to perform alternate control on the coarse tuning capacitor bank 5a and perform the equal number control on the PVT capacitor banks 5b.

Specifically, in that case, the control unit 10 generates, for example, a frequency control signal for coarse tuning and a frequency control signal for PVT compensation as frequency control signals. In addition, at the time of coarse tuning, on/off control of each unit cell 6 on the first capacitor group C1 side is performed using a value of an even bit (alternatively, odd bits) in the frequency control signal for coarse tuning as an on/off control value, and on/off control of each unit cell 6 on the second capacitor group C2 side is performed using a value of an odd bit (alternatively, even bits) as an on/off control value.

In addition, in the PVT compensation, when the maximum value of the number of capacity change stages is m, the number of unit cells 6b in the PVT capacitor bank 5b of each of the first capacitor group C1 and the second capacitor group C2 is set to m (0 to m−1) as illustrated in the drawing. Then, at the time of capacity tuning for PVT compensation, the control unit 10 uses the value of each control bit (0 to m−1 bits) of the frequency control signal for PVT compensation as an on/off control value to perform on/off control of each unit cell 6b on each of the first capacitor group C1 side and the second capacitor group C2 side.

In the PVT capacitor bank 5b, the minimum variable capacity is sufficiently larger than that of the coarse tuning capacitor bank 5a, that is, the capacity change amount of one unit cell 6 is sufficiently large, and thus it is easy to reduce the capacity of each unit cell 6. Therefore, as described above, the equal number control of the PVT capacitor bank 5b is performed. Since the PVT capacitor bank 5b has a large capacity change amount for one unit cell 6, it is desirable in terms of phase noise suppression not to cause a difference in the LC tank ratio X regardless of the number of capacity change stages by applying the equal number control.

Therefore, the effect of suppressing the phase noise can be enhanced by applying the equal number control to the PVT capacitor bank 5b out of the coarse tuning capacitor bank 5a and the PVT capacitor bank 5b.

In addition, although not illustrated, in a case where the fine tuning capacitor banks 5c are arranged in both of the first capacitor group C1 and the second capacitor group C2, either the equal number control or the alternate control can be performed as the capacity control.

Figure 14:
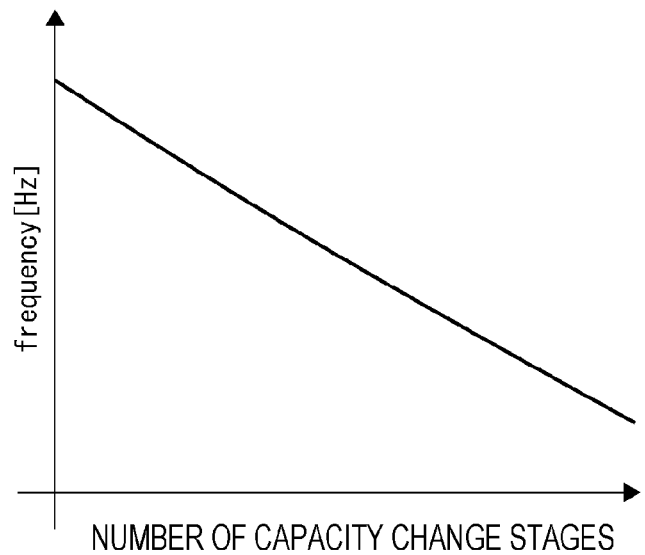
FIG. 14 is a graph illustrating an oscillation frequency characteristic of the oscillator according to the embodiment in a case where the alternate control is applied.

FIG. 14 illustrates an oscillation frequency characteristic in the oscillator 1. Specifically, FIG. 14 illustrates a change characteristic of the oscillation frequency with respect to a change in the number of capacity change stages in a case where the capacity control of the coarse tuning capacitor bank 5a is performed by the alternate control.

As can be seen with reference to [Formula 1] above, the oscillation frequency tends to decrease when the capacities of the first capacitor group C1 and the second capacitor group C2 are increased. FIG. 14 illustrates this tendency.

Figure 15:
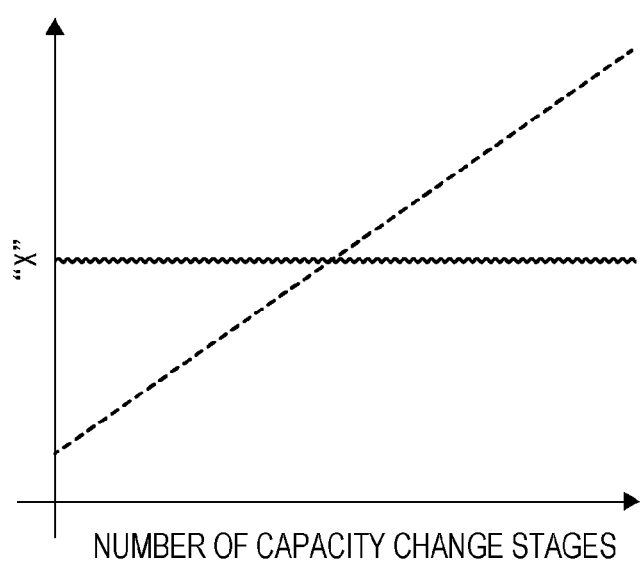
FIG. 15 is a graph illustrating a change characteristic of the LC tank ratio of the oscillator according to the embodiment in a case where the alternate control is applied.

FIG. 15 illustrates, as a change characteristic of the LC tank ratio X in the oscillator 1, a change characteristic of the LC tank ratio X with respect to a change in the number of capacity change stages in a case where the capacity control of the coarse tuning capacitor bank 5a is performed by the alternate control. In FIG. 15, for comparison, the same characteristic in a conventional case where the coarse tuning capacitor bank 5a is arranged only in one of the first capacitor group C1 and the second capacitor group C2 is indicated by a dotted line.

In the conventional case, the LC tank ratio X gradually increases as the number of capacity change stages increases. As the frequency changes, the LC tank ratio X changes to promote waveform collapse of the pseudo square wave, which causes deterioration of phase noise.

In this example, since the alternate control is adopted for the capacity control of the coarse tuning capacitor bank 5a, the LC tank ratio X slightly rises and falls according to the increase in the number of capacity change stages, specifically, rises and falls with the capacity change amount of one unit cell 6a (the minimum variable capacity of the unit cell 6a) as the fluctuation width. However, since the minimum variable capacity of the unit cell 6a in the coarse tuning capacitor bank 5a is small, it can be regarded that the LC tank ratio X remains substantially constant with respect to the frequency change. Therefore, the phase noise can be suppressed as compared with the related art.

5. Application Example of Oscillator

An application example of the oscillator 1 of an embodiment will be described with reference to FIGS. 16 and 17.

Figure 16:
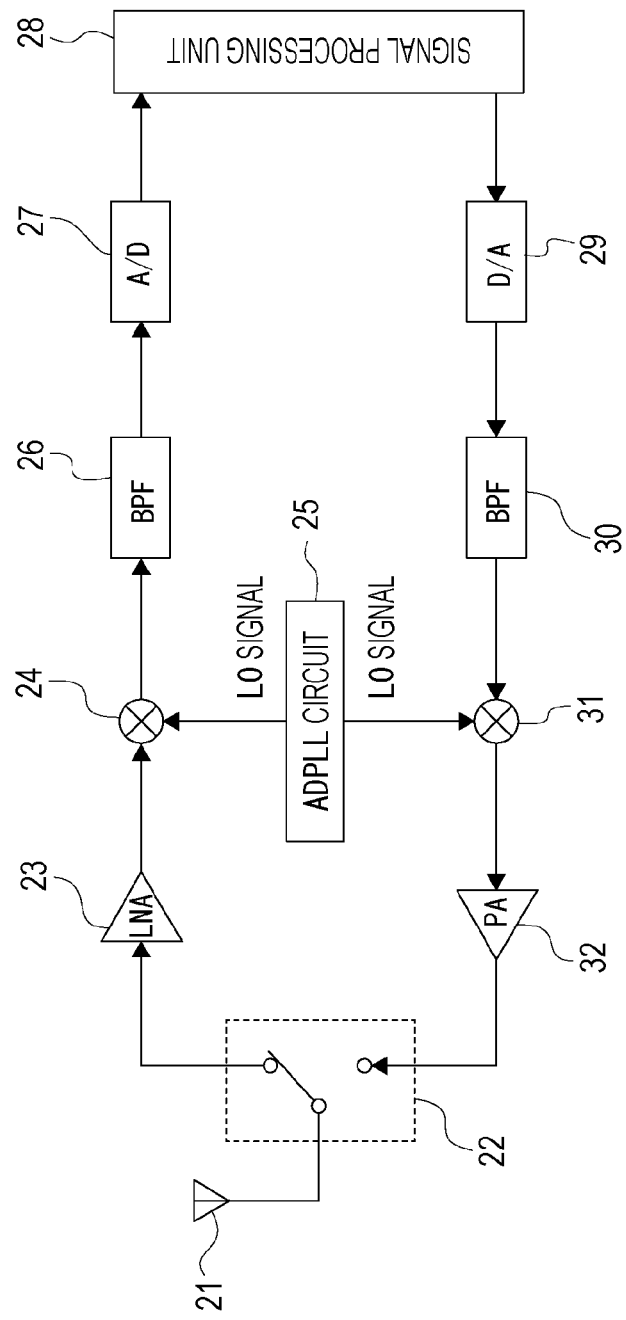
FIG. 16 is a diagram illustrating a configuration example of a signal processing apparatus of an embodiment.

The oscillator 1 is applicable to a transceiver 20 as illustrated in FIG. 16.

Figure 17:
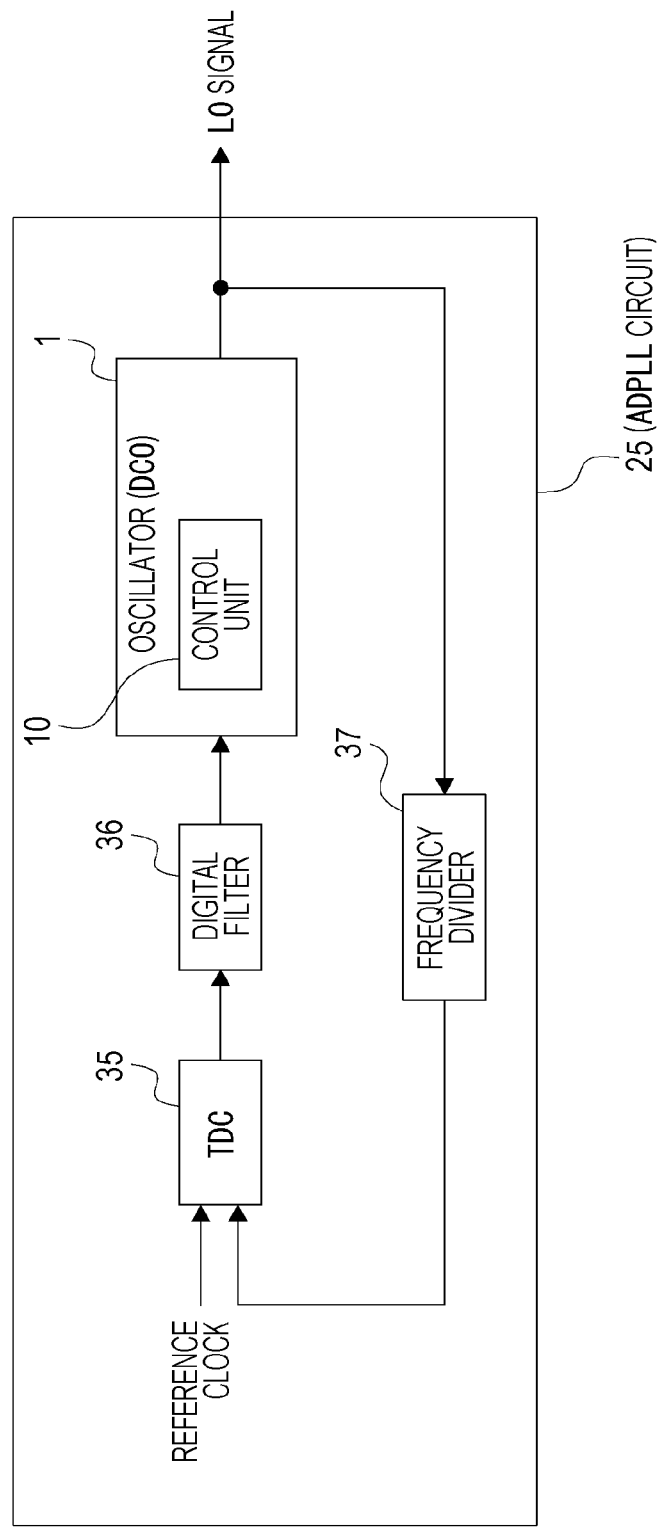
FIG. 17 is a diagram illustrating an internal configuration example of an ADPLL circuit included in the signal processing apparatus of an embodiment.

Specifically, the transceiver 20 is configured as a radio frequency (RF) transceiver, and the oscillator 1 is applicable as a digital controlled oscillator (DCO) in a phase locked loop (PLL) circuit that is provided in the RF transceiver and generates a local oscillator (LO) signal (refer to FIG. 17).

In FIG. 16, the transceiver 20 includes an antenna 21, a switching unit 22, a low noise amplifier (LNA) 23, a mixer 24, an all digital (AD) PLL circuit 25, a band pass filter (BPF) 26, an analog to digital (A/D) converter 27, a signal processing unit 28, a digital to analog (D/A) converter 29, a BPF 30, a mixer 31, and a power amplifier (PA) 32.

The antenna 21 is a transmission/reception antenna, and is connected to a circuit on the transmission side by the switching unit 22 at the time of signal transmission to perform signal transmission, and is connected to a circuit on the reception side by the switching unit 22 at the time of signal reception to perform signal reception.

In the circuit on the reception side, the reception signal by the antenna 21 is amplified by the LNA 23 and then input to the mixer 24. The mixer 24 mixes the LO signal output from the ADPLL circuit 25 with the input reception signal to extract a signal component of a necessary frequency.

From the reception signal subjected to the mixing processing by the mixer 24, unnecessary components are further removed by the BPF 26, and the reception signal is converted into a digital signal by the A/D converter, and input to the signal processing unit 28.

The signal processing unit 28 performs demodulation processing on the input reception signal, and at the time of transmission, generates a transmission signal by modulating data to be transmitted.

The transmission signal by the digital signal generated by the signal processing unit 28 is converted into an analog signal by the D/A converter 29, then input to the mixer 31 via the BPF 30, and mixed with the LO signal by the ADPLL circuit 25. As a result, a transmission signal oscillating by the frequency of the LO signal is obtained.

The transmission signal subjected to the mixing processing by the mixer 31 is amplified by the PA 32 and transmitted by the antenna 21 via the switching unit 22.

FIG. 17 is a diagram illustrating an internal configuration example of the ADPLL circuit 25.

In the ADPLL circuit 25, a feedback loop circuit including a time to digital converter (TDC) 35, a digital filter 36, an oscillator 1 as a DCO, and a frequency divider 37 is formed. The TDC 35 functions as a phase difference detector that detects a phase error between the reference clock and the output signal from the frequency divider 37 by a digital signal. The frequency divider 37 frequency-divides (multiplies) the output signal of the oscillator 1 to any integral multiple frequency and outputs the frequency.

The phase difference signal detected by the TDC 35 is input to the digital filter 36 as a loop filter, subjected to a filtering processing for blocking unnecessary short-period fluctuations in the feedback loop, and input to the oscillator 1.

The oscillator 1 functions as a frequency-variable oscillator of which oscillation frequency changes on the basis of the phase difference signal having passed through the digital filter 36. At this time, the control unit 10 performs capacity control of at least the coarse tuning capacitor bank 5a by the above-described alternate control on the basis of the phase difference signal from the digital filter 36.

In the ADPLL circuit 25 as described above, the phase difference between the input signal as the reference clock (reference frequency) and the feedback signal of the oscillator 1 as the DCO is input to the DCO, and accordingly, the phases of the input signal and the output signal can be synchronized. At this time, since the phase difference between the reference clock and the frequency obtained by dividing the output signal of the DCO by the frequency divider 37 is input to the DCO, it is possible to generate an output signal in which the frequency of the input signal is increased to any integral multiple.

6. Modification Example

Here, the embodiment is not limited to the specific examples described above, and various configurations as modification examples can be adopted.

For example, although the configuration of the unit cell 6 is illustrated in an equivalent circuit diagram in the above description, the circuit configuration of the unit cell 6 may be the configuration illustrated in FIGS. 18A, 18B, 18C, 18D, 19A, and 19B.

Figure 18A:
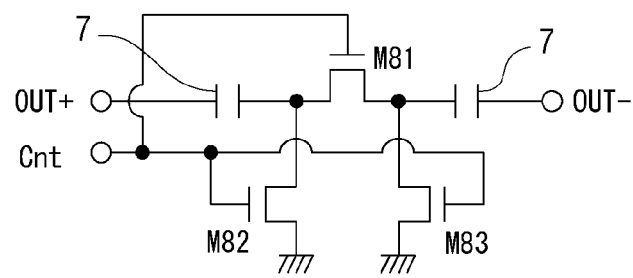
FIGS. 18A, 18B, 18C, and 18D are diagrams illustrating a configuration example of a unit cell in the case of using capacity by MOM.
Figure 18B:
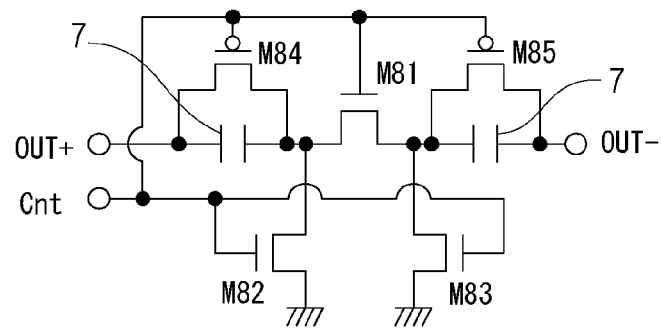
Figure 18C:
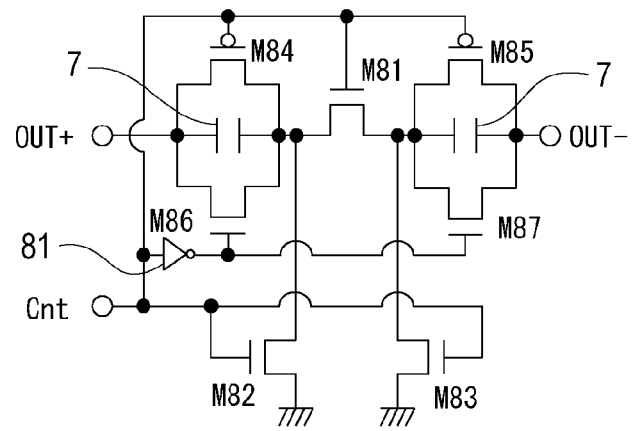
Figure 18D:
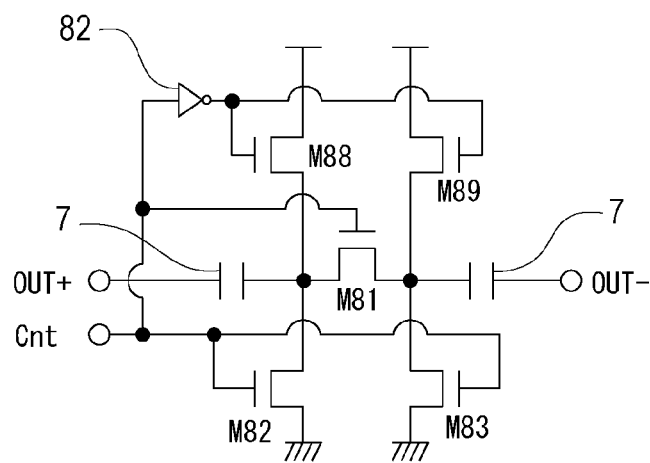
Figure 19A:
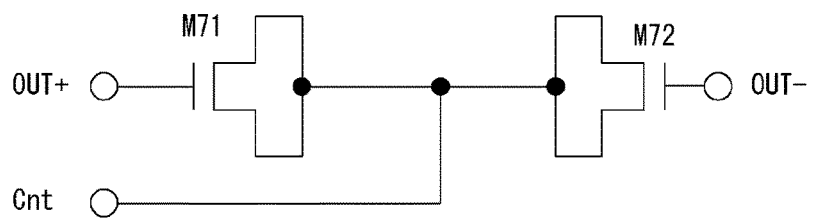
FIGS. 19A and 19B are diagrams illustrating a configuration example of a unit cell in the case of using capacity by a MOS transistor.
Figure 19B:
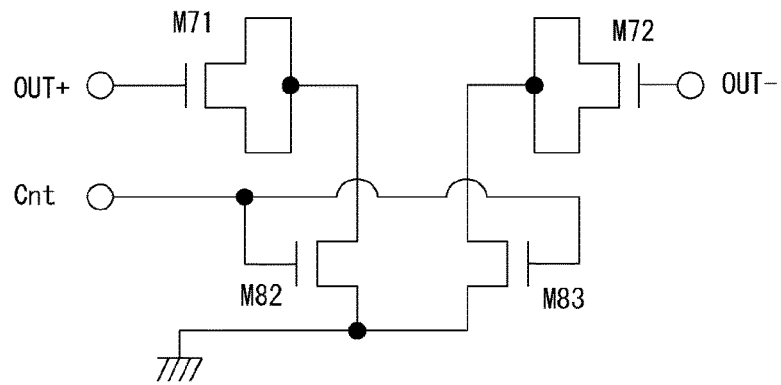

FIGS. 18A, 18B, 18C, and 18D illustrate a circuit configuration examples in a case where metal-oxide-metal (MOM) is used as the capacitor 7 of the unit cell 6, and FIGS. 19A and 19B illustrate a circuit configuration examples in a case where a MOS transistor is used as the capacitor 7.

In FIGS. 18A, 18B, 18C, and 18D, examples of using the capacitor 7 by MOM include examples illustrated in FIGS. 18A, 18B, 18C, and 18D.

In the example of FIG. 18A, three transistors M81, M82, and M83 are used for a circuit unit corresponding to the switch unit 8. Note that, in the present example, all the transistors denoted by reference signs "M" to be described below are constituted by MOSFETs.

In the example of FIG. 18A, the transistor M81 has a drain connected to the negative electrode side terminal of one capacitor 7 out of the two capacitors 7 and a source connected to the positive electrode side terminal of the other capacitor 7. The transistor M82 has a drain connected to the drain of the transistor M81 and a source grounded, and the transistor M83 has a drain connected to the source and a source grounded.

An n-channel MOSFET is used for the transistors M81, M82, and M83, and a control signal Cnt is supplied to each gate thereof. The control signal Cnt is a signal for controlling an on/off state of each unit cell 6.

In the configuration illustrated in FIG. 18A, in a state where the control signal Cnt is on, the transistors M81, M82, and M83 are turned on, and the two capacitors 7 are conducted to turn on the unit cell 6. On the other hand, in a state where the control signal Cnt is off, the transistors M81, M82, and M83 are turned off, the drain terminals of the transistors M82 and M83 are in an indefinite (high impedance) state, the two capacitors 7 are made non-conductive, and the unit cell 6 is turned off.

Subsequently, in the example illustrated in FIG. 18B, which is different from the example illustrated in FIG. 18A, a transistor M84 is connected to one capacitor 7 and a transistor M85 is connected to the other capacitor 7 respectively in parallel. A p-channel MOSFET is used for the transistors M84 and M85, and the control signal Cnt is supplied to the gate.

In the configuration illustrated in FIG. 18B, in a state where the control signal Cnt is on, the transistors M81, M82, and M83 are turned on, while the transistors M84 and M85 are turned off. When the transistor M81 is turned on, the two capacitors 7 are conducted to turn on the unit cell 6.

In addition, in a state where the control signal Cnt is off, the transistors M81, M82, and M83 are turned off, while the transistors M84 and M85 are turned on. Since the transistor M81 is turned off, the two capacitors 7 are made non-conductive, and the unit cell 6 is turned off.

In the example illustrated in FIG. 18C, which is different from the example illustrated in FIG. 18B, a transistor M86 is connected to one capacitor 7 and a transistor M87 is connected to the other capacitor 7 in parallel, and the control signal Cnt is supplied to the gates of the transistors M86 and M87 via an inverter 81. As the transistors M86 and M87, n-channel MOSFETs are used.

In the configuration illustrated in FIG. 18C, in a state where the control signal Cnt is on, the transistors M81, M82, and M83 are turned on, while the transistors M84, M85, M86, and M87 are turned off. When the transistor M81 is turned on, the two capacitors 7 are conducted to turn on the unit cell 6.

In addition, in a state where the control signal Cnt is off, the transistors M81, M82, and M83 are turned off, while the transistors M84, M85, M86, and M87 are turned on. Since the transistor M81 is turned off, the two capacitors 7 are made non-conductive, and the unit cell 6 is turned off.

In the example of FIG. 18D, which is different from FIG. 18A, transistors M88 and M89 and an inverter 82 are added. Specifically, n-channel MOSFETs are used as the transistors M88 and M89, the transistor M88 is inserted between the connection point between one capacitor 7 and the transistor M82 and the power supply, the transistor M89 is inserted between the connection point between the other capacitor 7 and the transistor M83 and the power supply, and the control signal Cnt is supplied to each gate of the transistors M88 and M89 via the inverter 82.

The difference from the example of FIG. 18A is that the set of transistors M82 and M83 is complementarily turned on/off with respect to the set of transistors M88 and M89 according to the on/off of the control signal Cnt.

In FIGS. 19A and 19B, examples using a MOS transistor (71, 72) as the capacitor 7 include examples illustrated in FIGS. 19A and 19B.

In the example of FIG. 19A, the drains and sources of the MOS transistors M71 and M72 are connected, and the control signal Cnt is supplied to a connection point between the source and the drain of the MOS transistor M71 and a connection point between the source and the drain of the MOS transistor M72, respectively.

In such a configuration, when the control signal Cnt is turned on, the MOS transistors M71 and M72 functioning as the capacitors 7 are charged, and the unit cell 6 is turned on. On the other hand, when the control signal Cnt is turned off, the MOS transistors M71 and M72 are discharged, and the unit cell 6 is turned off.

In the example illustrated in FIG. 19B, which is different from FIG. 19A, the transistors M82 and M83 by the n-channel type MOSFET is added. Specifically, the drain of the transistor M82 is connected to the connection point between the source and the drain of the MOS transistor M71, the drain of the transistor M83 is connected to the connection point between the source and the drain of the MOS transistor M72, each source of the transistors M82 and M83 are grounded, and the control signal Cnt is supplied to each gate.

In such a configuration, when the control signal Cnt is turned on, the transistors M82 and M83 are turned on, the MOS transistors M71 and M72 are charged, and the unit cell 6 is turned on. On the other hand, when the control signal Cnt is turned off, the transistors M82 and M83 are turned off, the MOS transistors M71 and M72 are discharged, and the unit cell 6 is turned off.

Note that, in the above description, an application example to the DCO in the PLL circuit included in the RF transceiver has been described as an application example of the oscillator according to the present technology. However, the oscillator according to the present technology can be widely and suitably applied not only to the RF transceiver but also to all signal processing apparatuses configured to perform signal processing on the basis of a periodic signal having a variable frequency.

7. Summary of Embodiments

As described above, an oscillator (1) of the embodiment that functions as a transformer-based LC oscillator including a first capacitor group (first capacitor group C1) connected in parallel to a primary-side winding (inductor L1) of a transformer (3) and forming a first LC tank together with the primary-side winding, and a second capacitor group (second capacitor group C2) connected in parallel to a secondary-side winding (inductor L2) of the transformer and forming a second LC tank together with the secondary-side winding, the oscillator includes: a first type capacitor bank that is a capacitor bank having a maximum variable capacity of a predetermined value or more, and a second type capacitor bank that is a capacitor bank having a maximum variable capacity of less than the predetermined value, as capacitor banks (5) for oscillation frequency tuning, and the first type capacitor banks are arranged in both of the first capacitor group and the second capacitor group.

By arranging the capacitor banks in both of the first and second capacitor groups, it is possible to prevent the LC tank ratio from changing even when the capacity value of the capacitor bank changes for the oscillation frequency tuning. At this time, by arranging the first type capacitor banks having a large maximum variable capacity in both of the first and second capacitor groups, it is possible to effectively suppress the change amount of the LC tank ratio accompanying the oscillation frequency tuning.

Therefore, collapse of the oscillation waveform due to the oscillation frequency tuning can be suppressed, and phase noise can be suppressed.

In addition, in the oscillator according to the embodiment, the first type capacitor bank in the first capacitor group and the first type capacitor bank in the second capacitor group have the same number of unit cells (6) as a minimum unit of variable capacity.

Since the number of unit cells is the same, even in a case where all the unit cells of the first type capacitor banks are turned on in both of the first and second capacitor groups, the uniformity of the LC tank ratio can be maintained.

Therefore, the phase noise can be suppressed.

Furthermore, in the oscillator according to the embodiment, the first type capacitor bank in the first capacitor group and the first type capacitor bank in the second capacitor group are arranged adjacent to each other in a plan view (refer to FIG. 10).

Arranging two capacitor banks adjacent to each other means that the capacitor banks are arranged without interposing another element therebetween.

Therefore, it is possible to prevent occurrence of a mismatch of the capacity resolution between the first type capacitor bank in the first capacitor group and the first type capacitor bank in the second capacitor group.

Furthermore, the oscillator according to the embodiment includes a capacitor bank for PVT compensation as the capacitor bank (refer to FIG. 7 and the like).

Thus, PVT compensation can be performed for tuning of the oscillation frequency.

Therefore, the accuracy of the oscillation frequency tuning can be improved.

Further, in the oscillator according to the embodiment, the capacitor banks for PVT compensation are arranged in both of the first capacitor group and the second capacitor group (refer to FIG. 7 and the like).

By arranging the capacitor banks for PVT compensation in both of the first and second capacitor groups, it is possible to prevent the LC tank ratio between the first and second LC tanks from changing according to the change in capacity for PVT compensation.

Therefore, the phase noise can be suppressed.

Further, in the oscillator according to the embodiment, a capacitor bank for fine tuning that is a capacitor bank having a minimum maximum variable capacity, and a capacitor bank for coarse tuning that is a capacitor bank having a maximum variable capacity larger than that of the capacitor bank for fine tuning, as the capacitor banks, is further provided, and the capacitor bank for coarse tuning is arranged in both of the first capacitor group and the second capacitor group (refer to FIG. 10 and the like).

By providing the capacitor bank for fine tuning, fine tuning of the oscillation frequency is possible, and by arranging the capacitor banks for coarse tuning having a large maximum variable capacity in both of the first and second capacitor groups, it is possible to prevent the LC tank ratio between the first and second LC tanks from greatly changing.

Therefore, in the transformer-based LC oscillator in which fine tuning of the oscillation frequency is possible, the phase noise can be suppressed.

Furthermore, in the oscillator according to the embodiment, the capacitor bank for fine tuning is arranged in the second capacitor group (refer to FIGS. 8 and 9).

As a result, the capacitor bank for fine tuning is inserted between the gates of the cross-coupled transistors in the transformer-based LC oscillator.

Therefore, by inserting the power supply filter into the power supply line to the second capacitor group side, it is possible to suppress the influence of power supply noise for fine tuning of the oscillation frequency using the capacitor bank for fine tuning, and to improve the accuracy of fine tuning of the oscillation frequency.

In addition, in the oscillator according to the embodiment, the capacitor bank for fine tuning is arranged in the first capacitor group (refer to FIG. 10).

Accordingly, it is possible to add capacity to the first capacitor group in response to a case where the primary-side winding is arranged inside the secondary-side winding and the inductance of the primary-side winding is smaller than the inductance of the secondary-side winding.

Therefore, the change in the LC tank ratio between the first and second LC tanks can be suppressed, and the phase noise can be suppressed.

Furthermore, in the oscillator according to the embodiment, the first capacitor group is connected to each drain of a cross-coupled transistor, and the second capacitor group is connected to each gate of the cross-coupled transistor (refer to FIGS. 2, 10, and the like).

As a result, a transformer-based LC oscillator can be realized.

Furthermore, in the oscillator according to the embodiment, each of the first type capacitor bank in the first capacitor group and the first type capacitor bank in the second capacitor group includes a plurality of unit cells each serving as a minimum unit of a variable capacity, the oscillator includes a control unit (10) configured to change an oscillation frequency by performing on/off control of the unit cell on the basis of a frequency control signal indicating the number of capacity change stages, and when the number of capacity change stages indicated by the frequency control signal is N (N is an integer equal to or greater than 0), the control unit performs, as capacity control based on the frequency control signal, control to turn on (a quotient of N/2) unit cells for the first type capacitor bank in one of the first and second capacitor groups, and turn on N−(a quotient of N/2) unit cells for the first type capacitor bank in the other of the first and second capacitor groups (refer to FIGS. 12, 13, and the like).

In the oscillation frequency tuning, as a method of controlling the capacities of the first type capacitor banks arranged in both of the first and second capacitor groups while suppressing the change in the LC tank ratio, a method of performing control to turn on N unit cells in both of the first type capacitor banks with respect to the number of capacity change stages N indicated by the frequency control signal is considered. The method of turning on the N unit cells in both of the first type capacitor banks as described above is suitable in terms of not causing a change in the LC tank ratio at the time of oscillation frequency tuning, but the capacity change amount for one stage of control is twice the variable capacity for one unit cell, and it is necessary to reduce the variable capacity for one unit cell to ½ in order to maintain the capacity change amount for one stage of control in the case of adopting the inductor-based configuration. However, in a case where the first type capacitor bank is a capacitor bank for coarse tuning, since the capacity change amount for each unit cell is originally small, it is practically difficult to reduce the capacity change amount for one unit cell to ½. That is, it is difficult to realize a transformer-based LC oscillator in which the first type capacitor banks are arranged in both of the first and second capacitor groups.

As described above, by performing the control in which (a quotient of N/2) unit cells are turned on for the first type capacitor bank which is one of the first and second capacitor groups and N–(a quotient of N/2) unit cells are turned on for the first type capacitor bank which is the other of the first and second capacitor groups, the capacity change amount for one control stage, that is, the capacity change amount of each unit cell can be equivalent to that in the case of adopting the inductor-based configuration, and it is possible to facilitate the realization of the transformer-based LC oscillator in which the first type capacitor banks are arranged in both of the first and second capacitor groups.

In addition, in the oscillator according to the embodiment, the frequency control signal includes a plurality of control bits, and each control bit is a signal indicating presence or absence of a capacity change for one stage, and the control unit uses a value of an even-numbered control bit of the frequency control signal as an on/off control value of the unit cell in the first type capacitor bank in one of the first and second capacitor groups, and uses a value of an odd-numbered control bit of the frequency control signal as an on/off control value of the unit cell in the first type capacitor bank in the other of the first and second capacitor groups.

As a result, it is possible to easily realize the capacity control in which one of the first type capacitor banks arranged in both of the first and second capacitor groups turns on (a quotient of N/2) unit cells and the other one turns on N–(a quotient of N/2) unit cells.

Furthermore, in the oscillator according to the embodiment, a capacitor bank for PVT compensation and a capacitor bank for coarse tuning having a minimum variable capacity smaller than that of the capacitor bank for PVT compensation are provided as the capacitor banks, the capacitor bank for PVT compensation and the capacitor bank for coarse tuning are arranged in both of the first capacitor group and the second capacitor group, and the control unit, as capacity control of the capacitor bank for coarse tuning with respect to the number of capacity change stages N indicated by a frequency control signal, performs control to turn on (a quotient of N/2) unit cells in the capacitor bank in one of the first and second capacitor groups, and turn on N–(a quotient of N/2) unit cells in the capacitor bank in the other of the first and second capacitor groups, and as capacity control of the capacitor bank for PVT compensation, with respect to the number of capacity change stages N indicated by a frequency control signal, performs control to turn on N unit cells in the capacitor banks in both of the first and second capacitor groups.

That is, the above-described alternate control is performed for the capacitor banks for coarse tuning, and the above-described equal number control is performed for the capacitor banks for PVT compensation. In a case where equal number control is performed, in order to maintain the capacity change amount for one control stage in the case of adopting the inductor-based configuration, it is necessary to reduce the capacity change amount for one unit cell to ½. However, in the capacitor bank for PVT compensation, the minimum variable capacity is sufficiently larger than that of the capacitor bank for coarse tuning, that is, the capacity change amount for one unit cell is sufficiently large, and thus it is easy to reduce the capacity of each unit cell. Therefore, as described above, the equal number control of the capacitor bank for PVT compensation is performed. Here, since the capacitor bank for PVT compensation has a large capacity change amount for one unit cell, the capacitor bank for PVT compensation is desirable in terms of phase noise suppression to apply the equal number control and not to cause a difference in the LC tank ratio regardless of the number of capacity change stages.

Therefore, the effect of suppressing the phase noise can be enhanced by applying the equal number control to the capacitor bank for PVT compensation out of the capacitor bank for coarse tuning and the capacitor bank for PVT compensation.

In addition, there is provided a signal processing apparatus (transceiver 20) according to the embodiment including: an oscillator (1) configured to function as a transformer-based LC oscillator including a first capacitor group connected in parallel to a primary-side winding in a transformer and forming a first LC tank together with the primary-side winding, and a second capacitor group connected in parallel to a secondary-side winding in the transformer and forming a second LC tank together with the secondary-side winding, include a first type capacitor bank that is a capacitor bank having a maximum variable capacity of a predetermined value or more, and a second type capacitor bank that is a capacitor bank having a maximum variable capacity of less than the predetermined value, as capacitor banks for oscillation frequency tuning, and have the first type capacitor banks arranged in both of the first capacitor group and the second capacitor group; and a signal processing unit (for example, the signal processing unit 28) configured to perform signal processing on the basis of a periodic signal obtained by the oscillator.

The signal processing apparatus as such an embodiment can also obtain the same operations and effects as those of the oscillator as the above-described embodiment. In addition, since the signal processing can be performed on the basis of an accurate periodic signal, the accuracy of the signal processing can be improved.

Note that the effects described in the present specification are merely examples and are not limited, and other effects may be provided.

8. Present Technology

Note that the present technology can also adopt the following configurations.

(1)

An oscillator that functions as a transformer-based LC oscillator including a first capacitor group connected in parallel to a primary-side winding of a transformer and forming a first LC tank together with the primary-side winding, and a second capacitor group connected in parallel to a secondary-side winding of the transformer and forming a second LC tank together with the secondary-side winding, the oscillator including:

a first type capacitor bank that is a capacitor bank having a maximum variable capacity of a predetermined value or more, and a second type capacitor bank that is a capacitor bank having a maximum variable capacity of less than the predetermined value, as capacitor banks for oscillation frequency tuning, in which the first type capacitor banks are arranged in both of the first capacitor group and the second capacitor group.

(2)
The oscillator according to the (1), in which
the first type capacitor bank in the first capacitor group and the first type capacitor bank in the second capacitor group have the same number of unit cells as a minimum unit of variable capacity.

(3)
The oscillator according to the (1) or (2), in which
the first type capacitor bank in the first capacitor group and the first type capacitor bank in the second capacitor group are arranged adjacent to each other in a plan view.

(4)
The oscillator according to any one of the (1) to (3), further including:
a capacitor bank for PVT compensation is provided as the capacitor bank.

(5)
The oscillator according to the (4), in which
the capacitor bank for PVT compensation is arranged in both of the first capacitor group and the second capacitor group.

(6)
The oscillator according to any one of the (1) to (5), further including:
a capacitor bank for fine tuning that is a capacitor bank having a minimum maximum variable capacity, and a capacitor bank for coarse tuning that is a capacitor bank having a maximum variable capacity larger than that of the capacitor bank for fine tuning, as the capacitor banks, in which the capacitor bank for coarse tuning is arranged in both of the first capacitor group and the second capacitor group.

(7)
The oscillator according to the (6), in which
the capacitor bank for fine tuning is arranged in the second capacitor group.

(8)
The oscillator according to the (6), in which
the capacitor bank for fine tuning is arranged in the first capacitor group.

(9)
The oscillator according to any one of the (1) to (8), in which
the first capacitor group is connected to each drain of a cross-coupled transistor, and the second capacitor group is connected to each gate of the cross-coupled transistor.

(10)
The oscillator according to any one of the (1) to (9), in which
each of the first type capacitor bank in the first capacitor group and the first type capacitor bank in the second capacitor group includes a plurality of unit cells each serving as a minimum unit of a variable capacity,
the oscillator includes a control unit configured to change an oscillation frequency by performing on/off control of the unit cell on the basis of a frequency control signal indicating the number of capacity change stages, and
when the number of capacity change stages indicated by the frequency control signal is N (N is an integer equal to or greater than 0), the control unit performs, as capacity control based on the frequency control signal, control to turn on (a quotient of N/2) unit cells for the first type capacitor bank in one of the first and second capacitor groups, and turn on N−(a quotient of N/2) unit cells for the first type capacitor bank in the other of the first and second capacitor groups.

(11)
The oscillator according to (10), in which
the frequency control signal includes a plurality of control bits, and each control bit is a signal indicating presence or absence of a capacity change for one stage, and
the control unit uses a value of an even-numbered control bit of the frequency control signal as an on/off control value of the unit cell in the first type capacitor bank in one of the first and second capacitor groups, and uses a value of an odd-numbered control bit of the frequency control signal as an on/off control value of the unit cell in the first type capacitor bank in the other of the first and second capacitor groups.

(12)
The oscillator according to (10) or (11), further including:
a capacitor bank for PVT compensation and a capacitor bank for coarse tuning having a minimum variable capacity smaller than that of the capacitor bank for PVT compensation, as the capacitor banks, in which
the capacitor bank for PVT compensation and the capacitor bank for coarse tuning are arranged in both of the first capacitor group and the second capacitor group, and
the control unit,
as capacity control of the capacitor bank for coarse tuning with respect to the number of capacity change stages N indicated by a frequency control signal, performs control to turn on (a quotient of N/2) unit cells in the capacitor bank in one of the first and second capacitor groups, and turn on N−(a quotient of N/2) unit cells in the capacitor bank in the other of the first and second capacitor groups, and
as capacity control of the capacitor bank for PVT compensation, with respect to the number of capacity change stages N indicated by a frequency control signal, performs control to turn on N unit cells in the capacitor banks in both of the first and second capacitor groups.

(13)
A signal processing apparatus including:
an oscillator configured to function as a transformer-based LC oscillator including a first capacitor group connected in parallel to a primary-side winding in a transformer and forming a first LC tank together with the primary-side winding, and a second capacitor group connected in parallel to a secondary-side winding in the transformer and forming a second LC tank together with the secondary-side winding, include a first type capacitor bank that is a capacitor bank having a maximum variable capacity of a predetermined value or more, and a second type capacitor bank that is a capacitor bank having a maximum variable capacity of less than the predetermined value, as capacitor banks for oscillation frequency tuning, and have the first type capacitor banks arranged in both of the first capacitor group and the second capacitor group; and
a signal processing unit configured to perform signal processing on the basis of a periodic signal obtained by the oscillator.

REFERENCE SIGNS LIST

1 Oscillator
2 Current source
3 Transformer

5 Capacitor bank
5a Coarse tuning capacitor bank
5b PVT capacitor bank
5c Fine tuning capacitor bank
6, 6a, 6b, 6c Unit cell
7, 7a, 7b, 7c Capacitor
8 Switch unit
9 Noise filter
10 Control unit
L, L1, L2 Inductor
R Resistor
C Capacitor group
C1 First capacitor group
C2 Second capacitor group
M1, M2, Mt1, Mt2 Transistor
Ct Capacitor
20 Transceiver
21 Antenna
22 Switching unit
23 LNA
24, 31 Mixer
25 ADPLL circuit
26, 30 BPF
27 A/D converter
28 Signal processing unit
29 D/A converter
32 PA
35 TDC
36 Digital filter
37 Frequency divider
M81 to M89 Transistor
M71, M72 MOS transistor
81, 82 Inverter

The invention claimed is:

1. An oscillator that functions as a transformer-based LC oscillator including a first capacitor group connected in parallel to a primary-side winding of a transformer and forming a first LC tank together with the primary-side winding, and a second capacitor group connected in parallel to a secondary-side winding of the transformer and forming a second LC tank together with the secondary-side winding, the oscillator comprising:
a first type capacitor bank that is a capacitor bank having a maximum variable capacity of a predetermined value or more, and a second type capacitor bank that is a capacitor bank having a maximum variable capacity of less than the predetermined value, as capacitor banks for oscillation frequency tuning, wherein
the first type capacitor bank is arranged in both of the first capacitor group and the second capacitor group,
each of the first type capacitor bank in the first capacitor group and the first type capacitor bank in the second capacitor group has a plurality of unit cells that are minimum units of variable capacity,
a control unit configured to change an oscillation frequency by performing on/off control of the unit cell on a basis of a frequency control signal indicating a number of capacity change stages is provided, and
when the number of capacity change stages indicated by the frequency control signal is N (N is an integer equal to or greater than 0), the control unit performs, as capacity control based on the frequency control signal, control to turn on (a quotient of N/2) unit cells for the first type capacitor bank in one of the first and second capacitor groups, and turn on N−(a quotient of N/2) unit cells for the first type capacitor bank in other of the first and second capacitor groups.

2. The oscillator according to claim 1, wherein
the first type capacitor bank in the first capacitor group and the first type capacitor bank in the second capacitor group have same number of unit cells as a minimum unit of variable capacity.

3. The oscillator according to claim 1, wherein
the first type capacitor bank in the first capacitor group and the first type capacitor bank in the second capacitor group are arranged adjacent to each other in a plan view.

4. The oscillator according to claim 1, wherein
a capacitor bank for PVT compensation is provided as the capacitor bank.

5. The oscillator according to claim 4, wherein
the capacitor bank for PVT compensation is arranged in both of the first capacitor group and the second capacitor group.

6. The oscillator according to claim 1, further comprising:
a capacitor bank for fine tuning that is a capacitor bank having a minimum maximum variable capacity, and a capacitor bank for coarse tuning that is a capacitor bank having a maximum variable capacity larger than that of the capacitor bank for the fine tuning, as the capacitor banks, wherein
the capacitor bank for the coarse tuning is arranged in both of the first capacitor group and the second capacitor group.

7. The oscillator according to claim 6, wherein
the capacitor bank for the fine tuning is arranged in the second capacitor group.

8. The oscillator according to claim 6, wherein
the capacitor bank for the fine tuning is arranged in the first capacitor group.

9. The oscillator according to claim 1, wherein
the first capacitor group is connected to each drain of a cross-coupled transistor, and the second capacitor group is connected to each gate of the cross-coupled transistor.

10. The oscillator according to claim 1, wherein
the frequency control signal includes a plurality of control bits, and each control bit is a signal indicating presence or absence of a capacity change for one stage, and
the control unit uses a value of an even-numbered control bit of the frequency control signal as an on/off control value of the unit cell in the first type capacitor bank in one of the first and second capacitor groups, and uses a value of an odd-numbered control bit of the frequency control signal as an on/off control value of the unit cell in the first type capacitor bank in the other of the first and second capacitor groups.

11. The oscillator according to claim 1, further comprising:
a capacitor bank for PVT compensation and a capacitor bank for coarse tuning having a minimum variable capacity smaller than that of the capacitor bank for PVT compensation, as the capacitor banks, wherein
the capacitor bank for PVT compensation and the capacitor bank for the coarse tuning are arranged in both of the first capacitor group and the second capacitor group, and
the control unit,
as capacity control of the capacitor bank for the coarse tuning with respect to the number of capacity change stages N indicated by a frequency control signal, performs control to turn on (a quotient of N/2) unit cells in the capacitor bank in one of the first and second capacitor groups, and turn on N−(a quotient of N/2)

unit cells in the capacitor bank in the other of the first and second capacitor groups, and as capacity control of the capacitor bank for PVT compensation, with respect to the number of capacity change stages N indicated by a frequency control signal, performs control to turn on N unit cells in the capacitor banks in both of the first and second capacitor groups.

12. A signal processing apparatus, comprising:

an oscillator configured to function as a transformer-based LC oscillator including a first capacitor group connected in parallel to a primary-side winding in a transformer and forming a first LC tank together with the primary-side winding, and a second capacitor group connected in parallel to a secondary-side winding in the transformer and forming a second LC tank together with the secondary-side winding, include a first type capacitor bank that is a capacitor bank having a maximum variable capacity of a predetermined value or more, and a second type capacitor bank that is a capacitor bank having a maximum variable capacity of less than the predetermined value, as capacitor banks for oscillation frequency tuning, and have the first type capacitor banks arranged in both of the first capacitor group and the second capacitor group; and a signal processing unit configured to perform signal processing on a basis of a periodic signal obtained by the oscillator, wherein in the oscillator, each of the first type capacitor bank in the first capacitor group and the first type capacitor bank in the second capacitor group has a plurality of unit cells that are the minimum units of variable capacity, a control unit configured to change an oscillation frequency by performing on/off control of the unit cell on a basis of a frequency control signal indicating a number of capacity change stages is provided, and when the number of capacity change stages indicated by the frequency control signal is N (N is an integer equal to or greater than 0), the control unit performs as capacity control based on the frequency control signal, control to turn on (a quotient of N/2) unit cells for the first type capacitor bank in one of the first and second capacitor groups, and turn on N−(a quotient of N/2) unit cells for the first type capacitor bank in the other of the first and second capacitor groups.

* * * * *